US00RE43836E

(19) United States
(12) Reissued Patent
Morris et al.

(10) Patent Number: US RE43,836 E
(45) Date of Reissued Patent: Nov. 27, 2012

(54) DYNAMIC FORWARD ERROR CORRECTION

(75) Inventors: Russell A. Morris, Keller, TX (US); Darrell W. Barabash, Grapevine, TX (US)

(73) Assignee: Intel Corporation, Santa Clara, CA (US)

(21) Appl. No.: 10/703,028

(22) Filed: Nov. 5, 2003

Related U.S. Patent Documents

Reissue of:
(64) Patent No.: 6,314,535
Issued: Nov. 6, 2001
Appl. No.: 09/314,578
Filed: May 18, 1999

(51) Int. Cl.
*H04J 3/16* (2006.01)
*H04L 1/20* (2006.01)

(52) U.S. Cl. ..... 714/708; 370/468; 714/774; 714/776

(58) Field of Classification Search ..... 714/708, 714/774, 704, 705, 706, 707, 776; 370/468
See application file for complete search history.

(56) References Cited

U.S. PATENT DOCUMENTS 4,908,827 A * 3/1990 Gates ..... 714/790
5,103,445 A * 4/1992 Ostlund ..... 370/329
5,260,987 A * 11/1993 Mauger ..... 455/560
5,463,628 A * 10/1995 Sorensen ..... 370/467
5,483,351 A * 1/1996 Mailloux et al. ..... 358/3.27
5,488,351 A 1/1996 Jouin et al. ..... 370/79
5,490,168 A * 2/1996 Phillips et al. ..... 375/224
5,526,399 A * 6/1996 Kameda ..... 455/74.1
5,533,004 A * 7/1996 Jasper et al. ..... 370/204
5,535,423 A * 7/1996 Dupuy ..... 455/449
5,544,171 A * 8/1996 Godecker ..... 370/337
5,546,411 A * 8/1996 Leitch et al. ..... 714/708
5,548,598 A * 8/1996 Dupont ..... 714/751
5,557,639 A * 9/1996 Heikkila et al. ..... 375/224
5,600,663 A * 2/1997 Ayanoglu et al. ..... 714/774
5,615,221 A * 3/1997 Karp et al. ..... 714/752
5,640,395 A * 6/1997 Hamalainen et al. ..... 370/322
5,640,686 A * 6/1997 Norimatsu ..... 455/74
5,682,403 A * 10/1997 Tu et al. ..... 375/220
5,699,365 A * 12/1997 Klayman et al. ..... 714/708
5,719,859 A * 2/1998 Kobayashi et al. ..... 370/347
5,757,813 A * 5/1998 Raith ..... 714/708
5,828,677 A * 10/1998 Sayeed et al. ..... 714/774
5,839,077 A * 11/1998 Kowaguchi ..... 455/517
5,931,964 A * 8/1999 Beming et al. ..... 714/748
6,044,485 A * 3/2000 Dent et al. ..... 714/774

* cited by examiner

*Primary Examiner* — Stephen M Baker
(74) *Attorney, Agent, or Firm* — Blakely, Sokoloff, Taylor & Zafman LLP

(57) ABSTRACT

A forward error correction (FEC) method is provided including an FEC dynamic central station and a plurality of FEC dynamic remote stations that transmit bearer data and corresponding error correction data therebetween during a plurality of time frames. The error rate of the communication channel is measured and the amount of error correction data transmitted is accordingly and dynamically adjusted, so that the minimum amount of overhead required to effectively transmit the error correction data is used.

36 Claims, 14 Drawing Sheets

DYNAMIC FORWARD ERROR CORRECTION

Matter enclosed in heavy brackets [ ] appears in the original patent but forms no part of this reissue specification; matter printed in italics indicates the additions made by reissue.

FIELD OF THE INVENTION

The present inventions pertain to the field of error correction in communication systems, including more specifically, forward error correction arrangements.

BACKGROUND OF THE INVENTION

Digital communications systems utilize communication channels over which traffic data is communicated. These channels are typically bandwidth limited, having a finite channel capacity. The channel capacity together with other properties of the channel, such as various forms of noise and interference, will, with statistical certainty, cause, or otherwise result, in the injection of error conditions in the traffic data communicated over the channel. The effects of these error conditions may be particularly evident in wireless communications systems, which utilize generally unpredictable over-the-air communications channels through which remote stations communicate with a central station.

A technique for eliminating, or at least reducing, the effects of these error conditions is called Forward Error Correction (FEC). In general, the employment of an FEC technique entails transmitting error detection data and error correction data along with the bearer data. The error detection data and error correction data are typically derived from the bearer data itself by employing an error detection algorithm and error correction algorithm known to the receiver as well as the transmitter, and in the case of a digital wireless communications systems, a remote station and a central station in communication with one another.

FEC techniques have been employed in Time Division Multiple Access (TDMA) and Code Division Multiple Access (CDMA) wireless communications systems. For example, TDMA systems typically allow communication between a plurality of remote stations and a central station using the same frequency band and transmitting bearer data between remote stations and the central station during discrete time periods (i.e., each remote station transmits and receives bearer data broken up into bearer data bursts during respective time slots of cyclically repeating time frames).

In wireless communication, prior to transmission, the central station or remote station appends or encodes the bearer data with error detection data and error correction data according to a respective error detection algorithm and error correction algorithm. The reciprocal remote station or central station receives each error correctable bearer data packet, automatically corrects any errors in each error correctable bearer data packet (within the limits of the error correction algorithm) by processing the error correctable bearer data packet according to the error correction algorithm, and detects any residual errors in each corrected bearer data packet by processing the corrected bearer data packet according to the error detection algorithm.

The use of an FEC technique to eliminate or reduce the effects of transmission errors, however, does not come without a cost to the communications system. The transmission bandwidth available to a user transmitting in a particular time slot in known systems is reduced by the overhead required to transmit the error correction data. The transmission of error correction data with each error correctable bearer data packet can require 100% or more overhead in some instances. This increase in overhead typically results in either a longer time slot or a reduction in the bandwidth available for the traffic data (for a fixed transmission bit rate). In addition, in known wireless communications systems, the Bit Error Rate (BER) of the traffic data communicated between a central station and a remote station depends on dynamically varying conditions, such as, the relative distance between the remote station and the central station, interference, environmental conditions, traffic data transmission rate, etc.

As a result, the BER of bearer data transmitted between the central station and a remote station varies with each particular remote station and with time with respect to each remote station making it difficult to systematically select an FEC error correction algorithm that optimizes both the transmission overhead and error protection capability. To provide high quality communication between the central station and any given remote station during any given time period, the error correction algorithm is generally selected based on the worst-case BER, and is thus overly robust in most situations, resulting in undesirably high overhead and reduced overall data throughput for the system.

There thus is a need for a communications system that employs an FEC arrangement that among other things, maximizes the amount of bearer data transmitted between the central station and any given remote station at any given time, while still providing an acceptable error rate.

SUMMARY OF THE INVENTION

The present inventions comprise a novel method of dynamically varying the transmission of error correction data in communications systems.

In a preferred method of the present inventions, a first plurality of error correctable bearer data packets is transmitted between a first communications device and a second communications device during a first multi-frame (i.e., a plurality of time frames). An initial error correction algorithm is selected from a plurality of error correction algorithms, which is then employed to generate error correction data. The error correction data is transmitted with the bearer data packets by, such as, e.g., appending or encoding the error correction data thereto, creating the first plurality of error correctable bearer data packets. The plurality of error correction algorithms can comprise any number of different error correction algorithms, which may include no error correction algorithm. Upon receipt of the first plurality of error correctable bearer data packets, errors that are injected into the first plurality of error correctable bearer data packets during the transmission thereof are corrected within the limits of the selected error correction algorithm.

The error rate level of the communications channel between the first communications terminal and the second communications terminal is determined during the first multi-frame. The error rate level of the communications channel may be determined by such techniques as, e.g., measuring the number of defective corrected bearer data packets (i.e., block error rate (BLER)) or measuring the number of bit errors in the uncorrected bearer data packets (i.e., bit error rate (BER)). A subsequent error correction algorithm, which may be the same as the initial error correction algorithm, is selected from the plurality of error correction algorithms based in part upon the determined error rate level.

A second plurality of error correctable bearer data packets is transmitted between the first communications terminal and the second communications terminal during a second multi-frame. The subsequent selected error correction algorithm is employed to generate error correction data, which is transmitted with the second plurality of error correctable bearer data packets. The second plurality of error correctable bearer data packets are corrected within the limits of the second selected error correction algorithm. The error rate level of the communication channel between the first communications terminal and the second communications terminal is determined during the second multi-frame. A third error correction algorithm, which can be the same as or different from the second selected error correction algorithm, is selected from the plurality of error correction algorithms based in part upon the determined error rate level.

The third selected error correction algorithm is employed to correct the third plurality of error correctable bearer data packets transmitted between the first communications terminal and the second communications terminal during the third multi-frame. This error correction algorithm selection and error correctable bearer data packet correction process is repeated during future multi-frames.

DETAILED DESCRIPTION OF THE PREFERRED EMBODIMENTS

Figure 1:
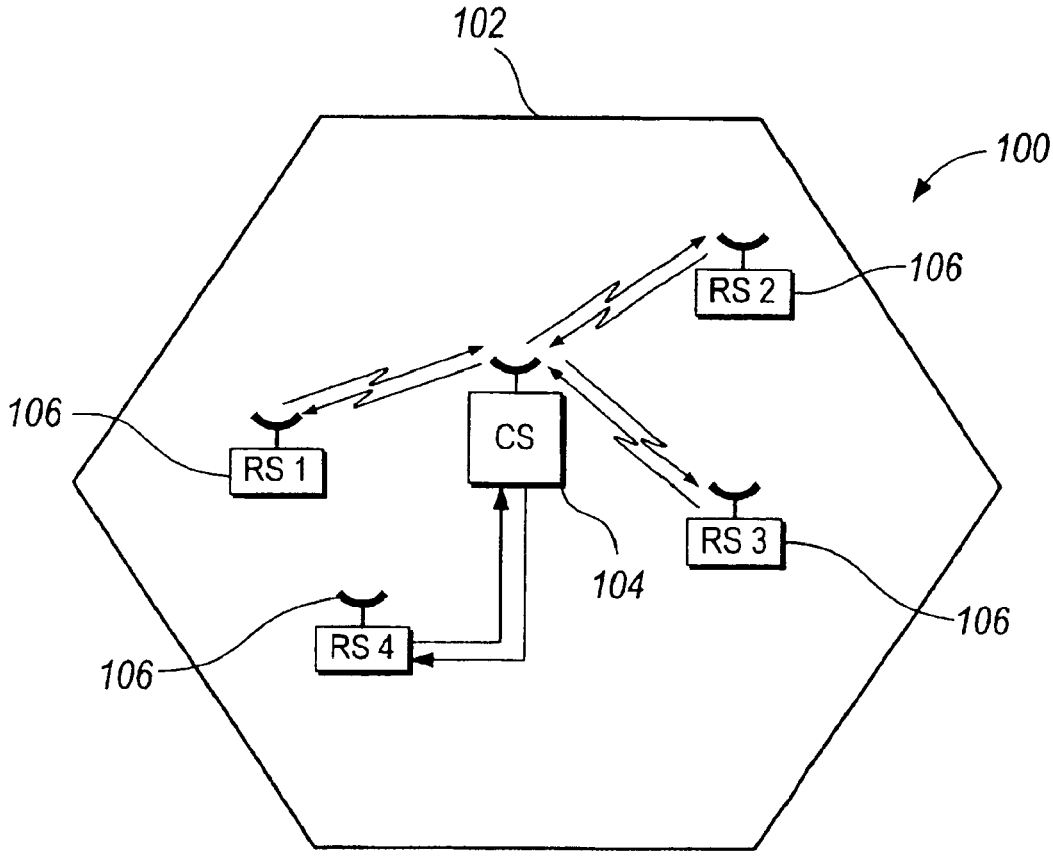
FIG. 1 is a representative block diagram of a wireless communication system cell showing an FEC dynamic central station communicating with a plurality of FEC dynamic remote stations.

FIG. 1 depicts a TDMA wireless communication system 100 arranged to operate in accordance with a preferred embodiment of the present inventions. An FEC dynamic central station 104 is depicted as communicating with respective FEC dynamic remote stations 106 within a cell 102. The cell 102 can be a macro-cell, micro-cell, wireless local loop, or any network in which multiple communication devices can communicate with one another. The FEC dynamic central station 104 can be a base station, base station controller, mobile switching center, or any communication device that can communicate with multiple remote stations. The FEC dynamic remote stations 106 can be any combination of remote terminals (e.g., mobile handsets, wireless modems, wired communication terminals (R54), or wireless local loop terminals).

The FEC dynamic central station 104 and respective FEC dynamic remote stations 106 communicate in a Time Division Multiple Access/Frequency Division Duplex (TDMA/FDD) format. That is, respective communications between the FEC dynamic central station 104 and each of the FEC dynamic remote stations 106 are time isolated, and the downlink communication between the FEC dynamic central station 104 and a particular FEC dynamic remote station 106 is frequency isolated from the uplink communication between the FEC dynamic central station 104 and that particular FEC dynamic remote station 106. The FEC dynamic central station 104 transmits data to the FEC dynamic remote stations 106 over a single downlink frequency, such as, 1960 MHZ, and the FEC dynamic remote stations 106 transmit data to the FEC dynamic central station 104 over a single uplink frequency, such as, 1880 MHZ.

Figure 2:
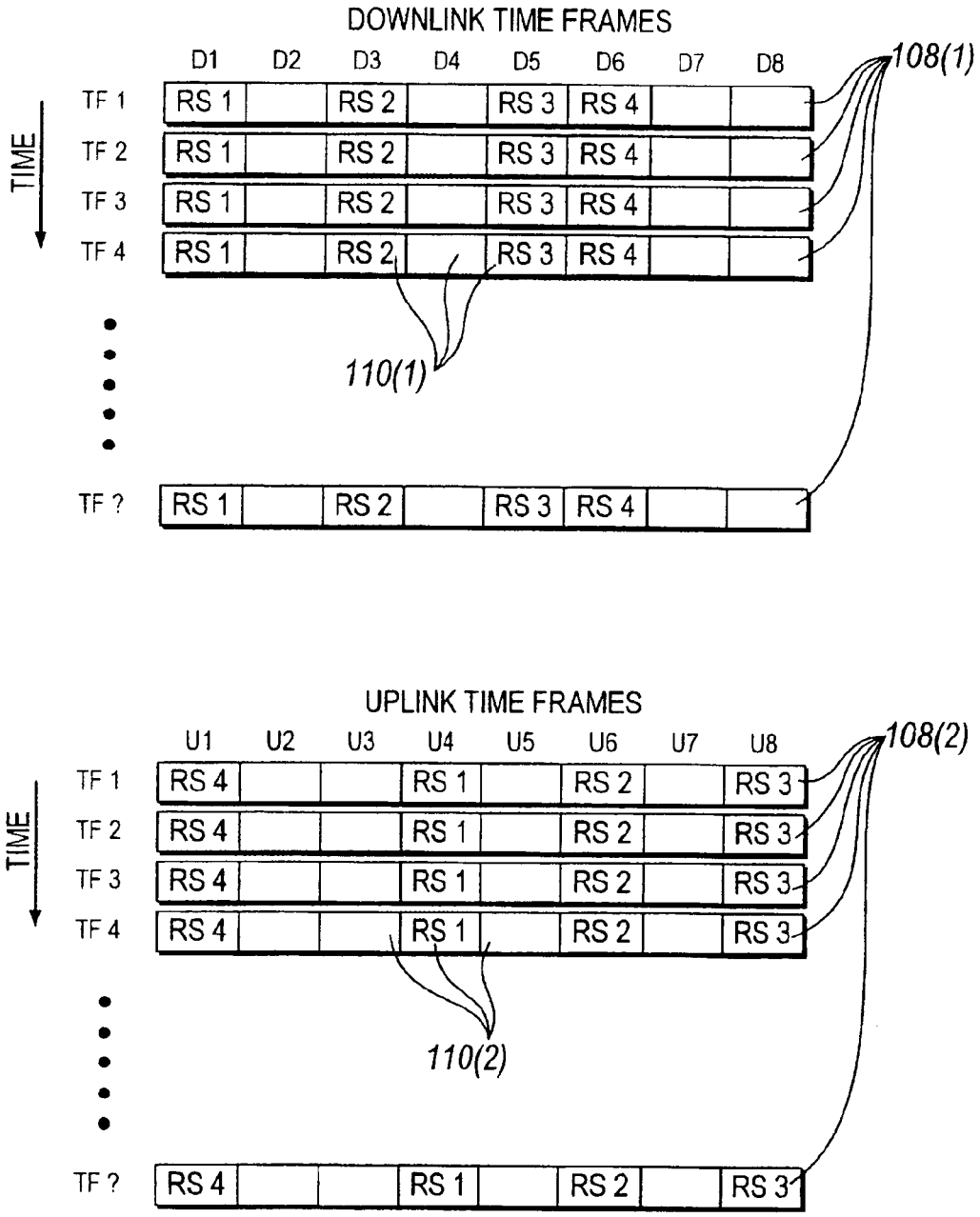
FIG. 2 depicts TDMA/FDD formatted downlink time frames and uplink time frames divided into a plurality of time slots.

As shown in FIG. 2, the downlink frequency is divided into cyclically repeating downlink time frames 108(1), and the uplink frequency is divided into cyclically repeating uplink time frames 108(2). The time frames 108(1)/(2) are further divided into respective sets of time slots 110(1)/(2). The uplink time frames 108(2) are synchronized with the downlink time frames 108(1).

The FEC dynamic remote stations 106 are respectively assigned time slots 110(1) in the downlink time frames 108(1) during which they receive downlink error correctable bearer data packets from the FEC dynamic central station 104 (in this case, time slots D1, D3, D5, and D6 for respective FEC dynamic remote stations 1-4). As such, the FEC dynamic central station 104 is assigned the same time slots 110(1) during which it transmits downlink error correctable bearer data packets to the respective FEC dynamic remote stations 106. The FEC dynamic remote stations 106 are respectively assigned time slots 110(2) in the uplink time frames 108(2) during which they transmit uplink error correctable bearer data packets to the FEC dynamic central station 104 (in this case, time slots U4, U6, U8, and U1 for respective FEC dynamic remote stations 1-4). As such, the FEC dynamic central station 104 is assigned the same respective time slots 110 during which it receives uplink error correctable bearer data packets from the respective FEC dynamic remote stations 106. As can be seen, several time slots of delay, and in this case three, are induced between corresponding downlink time slots 110(1) and uplink time slots 110(2) to obviate the need for installing additional equipment in the FEC dynamic remote stations 106. Depending on the particular protocol of the system, the empty time slots 110(1)/(2) are used as idle time slots for anticipated usage by other FEC dynamic remote stations 106, or alternatively, to support various other functions, such as transmission of control data between the FEC dynamic central station 104 and the FEC dynamic remote stations 106 or transmission of broadcast data from the FEC dynamic central station 104.

Figure 3:
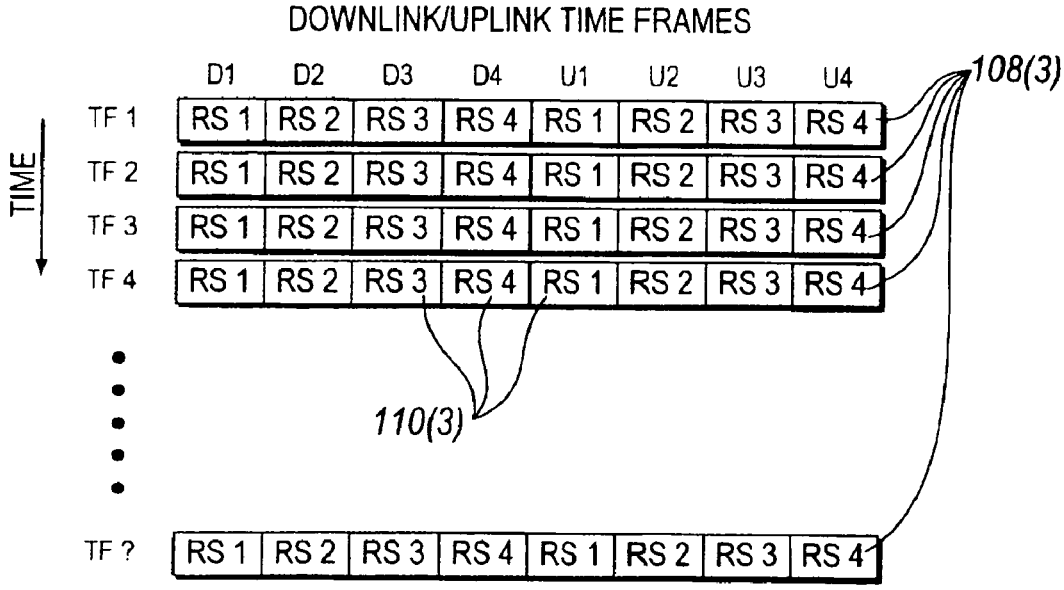
FIG. 3 depicts TDMA/TDD formatted downlink/uplink time frames divided into a plurality of time slots.

Alternatively, the wireless communications system 100 is configured in a TDMA/TDD format, wherein a single frequency is utilized for both downlink and uplink transmission of bearer data, and the downlink communication between the FEC dynamic central station 104 and a particular FEC dynamic remote station 106 is time isolated from the uplink communication between the FEC dynamic central station 104 and that particular FEC dynamic remote station 106. As shown in FIG. 3, the downlink/uplink frequency is divided into cyclically repeating time frames 108(3), which are further divided into time slots 110(3). Half of the time slots 110(3) are dedicated to downlink transmissions of data, and half of the time slots 110(3) are dedicated to uplink transmissions of data. It should be noted, however, that number of time slots 110(3) dedicated to the respective downlink and uplink transmissions can be unbalanced. Each FEC dynamic remote station 106 is assigned a pair of time slots 110(3) during which it can respectively receive downlink error correctable bearer data packets from the FEC dynamic central station 104 and transmit uplink error correctable bearer data packets to the FEC dynamic central station 104 (in this case, time slots (D1,U1), (D2,U2), (D3,U3), and (D4,U4) for respective FEC dynamic remote stations 1-4). As such, the FEC dynamic central station 104 transmits downlink error correctable bearer data packets to the respective FEC dynamic remote stations 106 and receives uplink error correctable bearer data packets from the respective FEC dynamic remote stations 106 during the same pairs of time slots 110(3).

Although FIG. 1 depicts only four FEC dynamic remote stations 106 in communication with the FEC dynamic central station 104 over a single frequency pair (TDMA/FDD) or single frequency (TDMA/TDD), in reality, the FEC dynamic central station 104 simultaneously communicates with many other FEC dynamic remote stations 106 over a broad range of frequencies or frequency pairs.

Figure 4A:
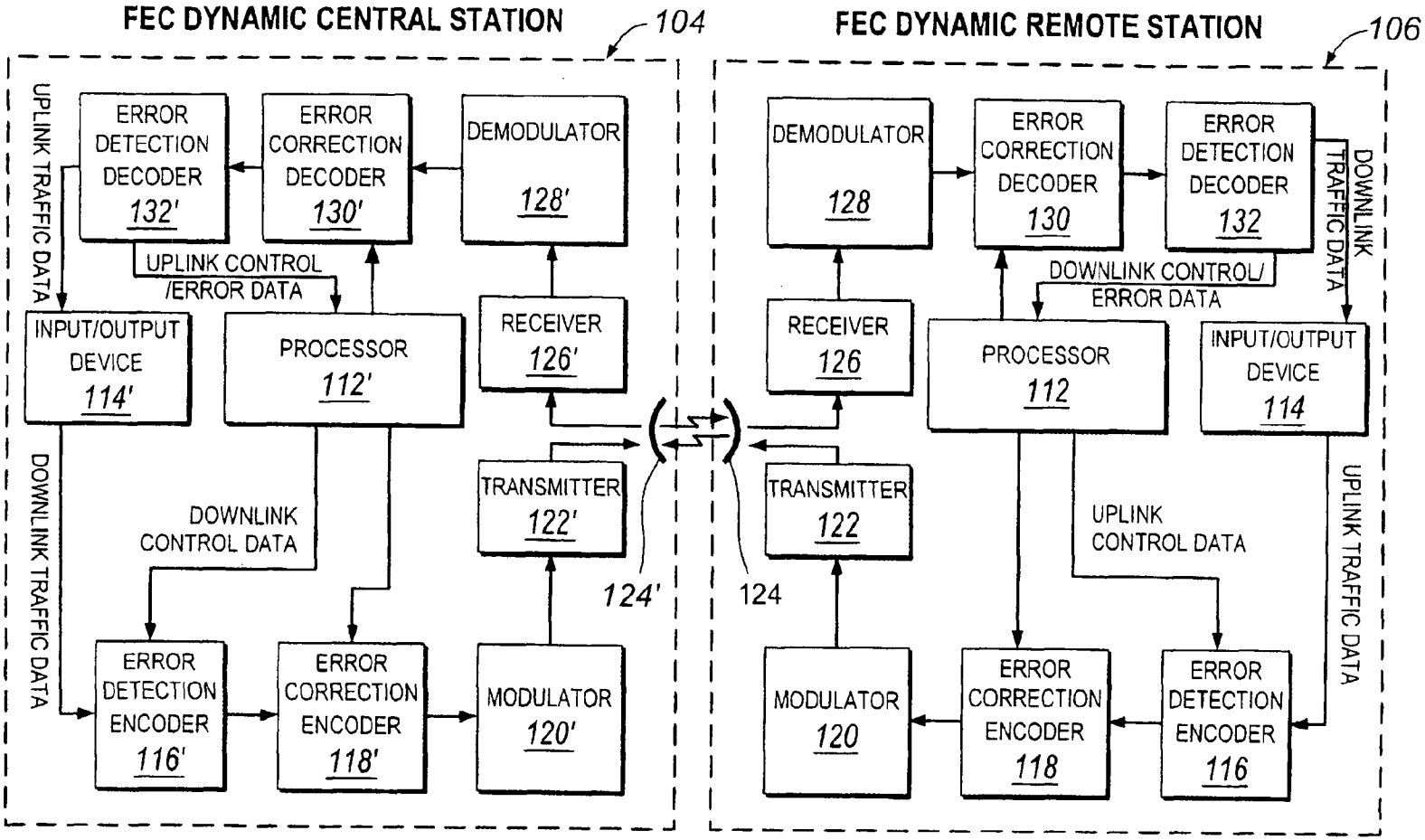
FIG. 4A is a representative block diagram of the FEC dynamic central station and one of the FEC dynamic remote stations.

FIG. 4A depicts a block diagram of the FEC dynamic central station 104 and one of the FEC dynamic remote stations 106 of the wireless communications system 100 in communication with each other. The FEC dynamic central station 104 and the FEC dynamic remote station 106 utilize a reciprocal adaptive FEC arrangement to ensure proper and efficient communication between the FEC dynamic central station 104 and the FEC dynamic remote station 106.

The FEC dynamic remote station 106 transmits uplink error correctable bearer data packets to the FEC dynamic central station 104 in accordance with the TDMA/FDD or TDMA/TDD arrangement as respectively depicted in FIGS. 2 and 3. The FEC dynamic remote station 106 comprises a processor 112 that orchestrates the timing of the error correctable uplink bearer data transmissions. The uplink error correctable bearer data packets comprise uplink traffic data originating from an input/output device 114 electrically coupled to the FEC dynamic remote station 106. The input/output device 114 is typically a voice encoder/decoder or data source/sink, such as, e.g., a personal computer (PC). The processor 112 is electrically coupled to and performs handshaking operations with the input/output device 114 during which uplink traffic data is transferred from the input/output device 114. The amount of uplink traffic data transferred from the input/output device 114 to form a single uplink bearer data packet can be varied by the processor 112. The input/output device 114 is electrically coupled and transfers uplink bearer data packets to an error detection encoder 116.

The processor 112 is also electrically coupled and transfers uplink control data (such as, e.g., status data informing the FEC dynamic central station 104), to the error detection encoder 116. The error detection encoder 116 appends the uplink bearer data packet with the uplink control data. The error detection encoder 116 also generates error detection data according to a cyclical redundancy check (CRC) algorithm and appends the uplink bearer data packet with the error detection data. The error detection encoder 116 can, however, employ other types of error detection algorithms without straying from the principles taught by this invention.

The error detection encoder 116 is electrically coupled to an error correction encoder 118, which appends error correction data onto the uplink bearer data packet according to an error correction algorithm, and in this case a Hamming error correction algorithm, to form an uplink error correctable bearer data packet. In alternative embodiments, a single error correction/error detection encoder comprises the error correction encoder 118 and error detection encoder 116.

The error correction encoder 118 is dynamic in that it is configured to employ, on-command, no error correction algorithm, thus generating no error correction data; a low-level Hamming error correction algorithm, which generates error correction data requiring 20% overhead to transmit for each uplink error correctable bearer data packet; or a high-level Hamming error correction algorithm, which generates error correction data requiring 100% overhead to transmit for each uplink error correctable bearer data packet. The overhead percentage is defined as the amount of error correction data relative to the amount of traffic data in an error correctable bearer data packet. As described further below, the processor 112 dynamically selects the particular error correction algorithm to be employed by the error correction encoder 118. In alternative embodiments, the particular type and amount of error correction algorithms available to the error correction encoder 118 vary from those described above. For instance, eleven error correction algorithms, whether of the Hamming type or otherwise, can be employed, with the overhead of the error correction algorithms varying by 10% between a range of 0% and 100%. In further alternative embodiments, an error correction algorithm can be variable, so that, rather than selecting an error correction algorithm, the overhead of the error correction algorithm is varied.

The error correction encoder 118 is electrically coupled to a modulator 120, which modulates the uplink error correctable bearer data packet onto a carrier frequency. The modulator 120 is electrically coupled to transmitter 122, which amplifies and filters the uplink error correctable bearer data packet. The transmitter is electrically coupled to an antenna 124, which transmits the uplink error correctable bearer data packet over-the-air to the FEC dynamic central station 104.

The FEC dynamic remote station 106 also receives downlink error correctable bearer data packets from the FEC dynamic central station 104 in accordance with the TDMA/FDD or TDMA/TDD arrangement respectively depicted in FIGS. 2 and 3. As with the uplink bearer data transmissions, the FEC dynamic remote station processor 112 orchestrates the timing of the downlink bearer data reception. The downlink error correctable bearer data packets comprise downlink traffic data originating from an input/output device 114' electrically coupled to the FEC dynamic central station 104. The input/output device 114' on the FEC dynamic central station 104 side of the wireless communications system 100 is typically an interface to a communications network, such as, e.g., a Public Switched Telephone Network (PSTN), or a data network, such as, e.g., the internet.

The antenna 124 receives a downlink error correctable bearer data packet over-the-air from the FEC dynamic central station 104. The antenna 124 is electrically coupled to the receiver 126, which selects the downlink error correctable bearer data packet channel. The receiver 126 is electrically coupled to a demodulator 128, which extracts the downlink error correctable bearer data packet from the radio frequency carrier.

The demodulator 128 is electrically coupled to an error correction decoder 130, which processes and corrects the downlink error correctable bearer data packet according to an error correction algorithm, and in this case, a Hamming error correction algorithm. Like the error correction encoder 118, the error correction decoder 130 is dynamic in that it is configured to operate in a manner consistent with the encoder algorithm applied to the current error correctable bearer data packet. As described further below, the processor 112 dynamically selects the particular error correction algorithm to be employed by the error correction decoder 130. In alternative embodiments, the particular type and amount of error correction algorithms available to the error correction decoder 130 vary from those described above.

The error correction decoder 130 can only correct the downlink error correctable bearer data packet within the limits of the particular error correction algorithm employed. Although the error correction decoder 130 attempts to correct the downlink error correctable bearer data packet, it is possible that the error correction decoder 130 can output a corrected downlink error correctable bearer data packet with a residual error.

The error correction decoder 130 is electrically coupled and transfers the corrected downlink error correctable bearer data packet to an error detection decoder 132, which processes and detects any residual errors in the corrected downlink error correctable bearer data packets according to an error detection algorithm, such as a CRC error detection algorithm. The error detection decoder 132 can, however, employ other types of error detection algorithms without straying from the principles taught by this invention. In alternative embodiments, a single error correction/error detection decoder comprises the error correction decoder 130 and error detection decoder 132.

The error detection decoder 132 separates the downlink control data from the corrected downlink bearer data packet, and may provide an indication that the corrected bearer data packet still has an error, initiating a bearer data packet retransmission. The error detection decoder 132 is electrically coupled and transfers the downlink bearer data packet to the input/output device 114 as downlink traffic data. The error detection decoder 132 is also electrically coupled and transfers the control data to the processor 112. The processor 112 is electrically coupled to and performs handshaking operations with the input/output device 114 during which downlink traffic data is transferred to the input/output device 114. The amount of downlink traffic data transferred to the input/output device 114 can be varied by the processor 112.

The FEC dynamic remote station processor 112 not only controls the timing of the transmission and reception functions of the FEC dynamic remote station 106, but is also internally configured and arranged with the input/output device 114, error correction encoder 118, error correction decoder 130, and error detection decoder 132 to orchestrate the reciprocal dynamic FEC arrangement of the present invention.

Figure 5A:
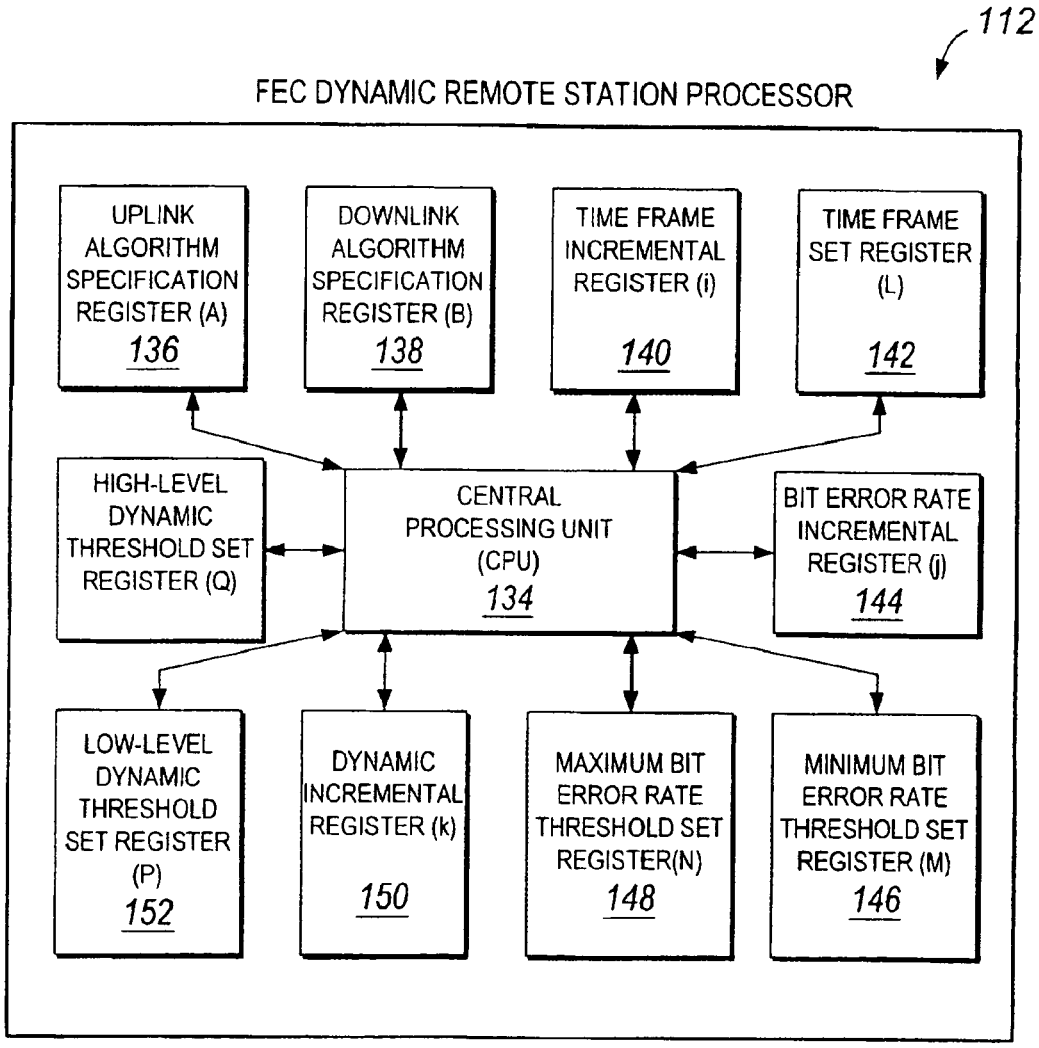
FIG. 5A is a representative block diagram of an FEC dynamic remote station processor.

As shown in FIG. 5A, the FEC dynamic remote station processor 112 comprises a Central Processing Unit (CPU) 134, which performs the processing functions in the FEC dynamic remote station 106. The processor 112 further comprises instructions that allow the FEC dynamic remote station 106 to dynamically generate uplink error correctable bearer data packets and dynamically correct downlink error correctable bearer data packets in accordance with the present inventions. These instructions preferably take the form of a computer software program embedded in memory, such as, e.g., a ROM chip, or fixed logic, such as, e.g., an ASIC, which can be either on-board or separate from the CPU 134. The FEC dynamic remote station processor 112 further comprises various memory locations for the storage of status data concerning the FEC arrangement employed by the wireless communications system 100. For the purposes of illustration, these memory locations are depicted in FIG. 5A as registers. It should be understood, however, that any memory storage vehicle that allows for the storage and access of data can be employed.

The FEC dynamic remote station processor 112 tracks the respective error correction algorithms that are employed by the error correction encoder 118 and error correction decoder 130. The processor 112 comprises an uplink algorithm specification register 136, which stores a data value (A) indicating the type and level of the error correction algorithm that is employed by the FEC dynamic remote station 106 to append the current uplink error correctable bearer data packet with error correction data. The data value (A) stored in the uplink algorithm specification register 136 is either equal to "0" indicating no error correction algorithm, "1" indicating the low-level error correction algorithm, or "2" indicating the high-level error correction algorithm. Again, the present invention is not to be limited to these particular error correction algorithms and can include other types of error correction algorithms without departing from the principles taught by this invention. As shown in FIG. 4A, the processor 112 is electrically coupled to the error correction encoder 118, so that the processor 112 can, after accessing the uplink algorithm specification register 136, transmit a control signal to the error correction encoder 118, specifying the particular error correction algorithm to be employed by the error correction encoder 118 when appending the current uplink error correctable bearer data packet with error correction data.

The FEC dynamic remote station processor 112 comprises a downlink algorithm specification register 138, which stores a data value (B) indicating the type and level of the error correction algorithm employed by the FEC dynamic remote station 106 to correct the current downlink error correctable bearer data packet with error correction data. The data value (B) stored in the downlink algorithm specification register 138 is equal to either "0" indicating no error correction algorithm, "1" indicating the low-level error correction algorithm, or "2" indicating the high-level error correction algorithm. As shown in FIG. 4A, the processor 112 is electrically coupled to the error correction decoder 130, so that the processor 112 can, after the CPU 134 accesses the downlink algorithm specification register 138, transmit a control signal to the error correction decoder 130 specifying the particular error correction algorithm to be employed by the error correction decoder 130 when correcting the current downlink error correctable bearer data packet.

Figure 7:
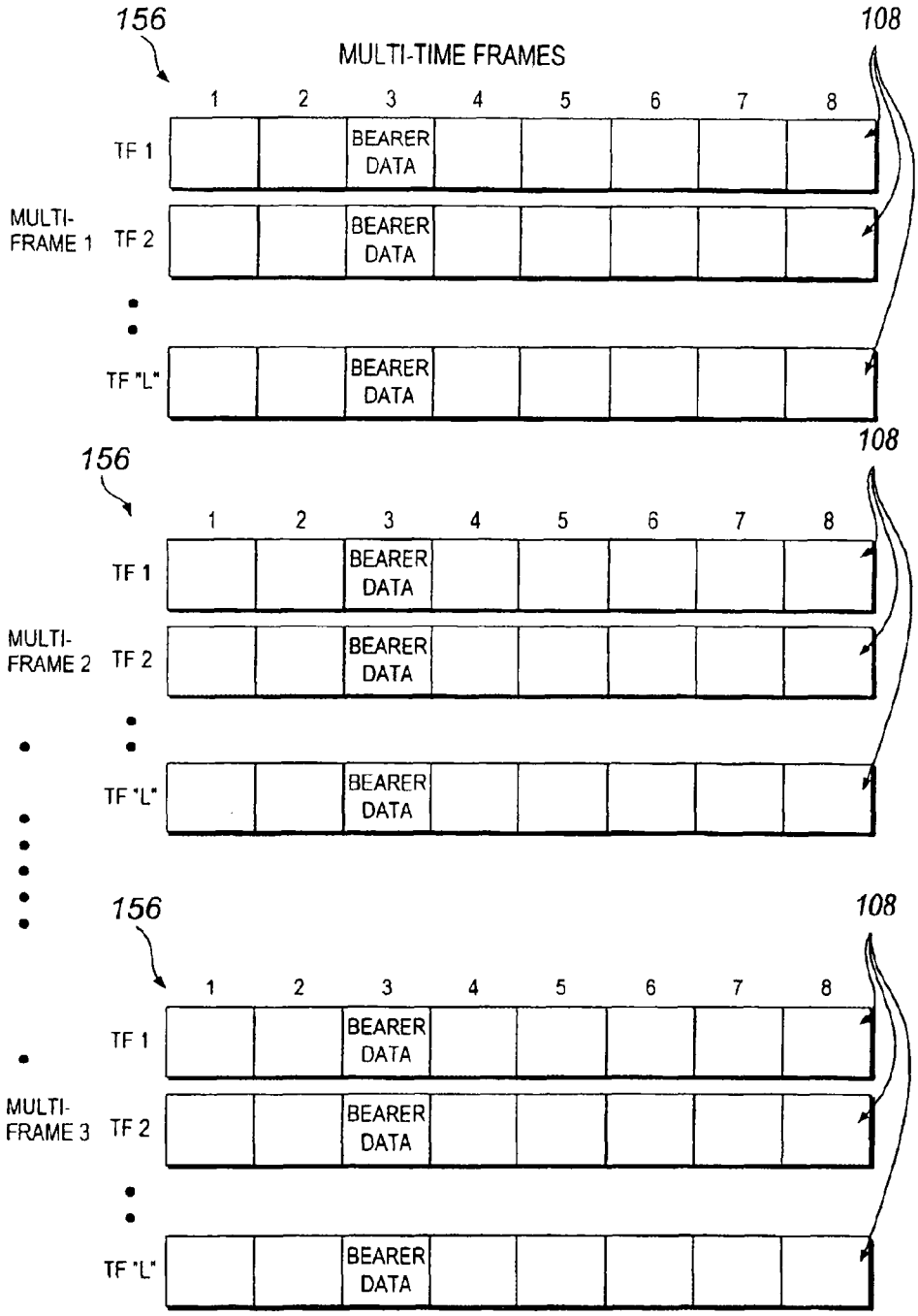
FIG. 7 depicts TDMA formatted multi-frames divided into a plurality of time frames.

As shown in FIG. 7, cyclically repeating time frames 108 are grouped into cyclically repeating multi-frames 156. The time frames 108 commonly represent the TDMA/FDD formatted downlink time frames 108(1) and uplink time frames 108(2) shown in FIG. 2 and the TDMA/TDD formatted downlink/uplink time frames 108(3) shown in FIG. 3. The multi-frames 156 commonly represent downlink multi-frames 156(1) and uplink time frames 156(2) respectively comprising the TDMA/FDD formatted downlink time frames 108(1) and uplink time frames 108(2), and the downlink/uplink multi-frames 156(3) comprising the TDMA/TDD formatted downlink/uplink time frames 108(3). The number of time frames 108 in each multi-frame 156 is dictated by the particular time frame 108 during which the FEC dynamic remote station processor 112 selects an error correction algorithm. That is, the processor 112 only selects an error correction algorithm during a particular time frame 108 considered as the last time frame 108 of the multi-frame 156, which may not have a fixed number of time frames 108.

The processor 112 comprises a time frame incremental register 140, which stores a data value (i) indicating the number of time frames 108 that have passed in the current multi-frame 156. As shown in FIG. 4A, the error detection decoder 132 is electrically coupled to the processor 112, so that the error detection decoder 132 can send a control signal to the processor 112 indicating receipt of a downlink error correctable bearer data packet. For each control signal sent from the error detection decoder 132 indicating that a downlink error correctable bearer data packet has been received by the FEC dynamic remote station 106, the data value (i) in the time frame incremental register 140 is incremented by one. The processor 112 comprises a multi-frame register 142, which stores a data value (L) indicating the time frame 108 of the current multi-frame 156 during which the processor 112 selects the error correction algorithm. The data value (L) is set by specifying the number of time frames 108 in the current multi-frame 156.

The CPU 134 compares the data value (i) in the time frame incremental register 140 with the data value (L) in the multi-frame register 142 to determine whether the current time frame 108 is the last time frame 108 in the current multi-frame 156, and thus whether the error correction algorithm should be currently selected. For instance, if the data value (L) is set to 100, the current multi-frame 156 includes 100 time frames 108. The CPU 134 selects the error correction algorithm if the data value (i) equals 100, indicating the 100th and last time frame 108 of the current set of 100 time frames 108.

The FEC dynamic remote station processor 112 determines an error rate level of the communication channel between the FEC dynamic remote station 106 and the FEC dynamic central station 104, and more particularly an actual block error rate (BLER) level of the downlink error correctable bearer data packets transmitted during the current multi-frame 156. It should be noted that for purposes of this specification, the current BLER level refers to the current BLER or any estimations thereof. The processor 112 comprises a BLER incremental register 144 that stores a data value (j) equal to the number of corrected downlink bearer data packets in which at least one residual error, i.e., a defective corrected downlink bearer data packet, exists. The current BLER level can be determined from the data value (j). The error detection decoder 132 is electrically coupled to the processor 112, so that the error detection decoder 132 can send to the processor 112 a control signal indicating the presence of a defective corrected downlink bearer data packet. For each control signal sent from the error detection decoder 132 indicating the presence of a defective corrected downlink bearer data packet, the data value (j) in BLER incremental register 144 is incremented by one.

As previously stated, during the last time frame 108 of the current multi-frame 156, the FEC dynamic remote station processor 112 selects one of the three error correction algorithms to be employed by the error correction encoder 118' of the FEC dynamic central station 104 and the error correction decoder 130 of the FEC dynamic remote station 106 during the next multi-frame 156. The processor 112 comprises a minimum BLER threshold set register 146 and a maximum BLER threshold set register 148, which respectively store data values (M) and (N) indicating the minimum tolerable BLER level, the triggering of which would indicate that the current error correction algorithm is too robust, and the maximum tolerable BLER level, the triggering of which would indicate that the current error correction algorithm is not robust enough. Thus, data value (M) is set by specifying a minimum BLER threshold level equal to a current BLER level that will trigger selection of the next lower error correction algorithm. Similarly, data value (N) is set by specifying a minimum BLER threshold level equal to a current BLER level that will trigger selection of the next higher error correction algorithm. Because the data value (N) represents a higher threshold than does the data value (M), the data value (N) is greater than the data value (M).

The CPU 134 respectively compares the data value (j) in the BLER incremental register 144 with the data value (M) in the minimum BLER threshold set register 146 and the data value (N) in the maximum BLER threshold set register 148 to determine which error correction algorithm is selected. For instance, if the data value (M) is set to 5, and the data value (N) is set to 15, the CPU 134 selects the next lower error correction algorithm if the data value (j) is less than 5. In this case, if the high-level error correction algorithm is currently being used, the CPU 134 selects the low-level error correction algorithm, and if the low-level error correction algorithm or no error correction algorithm is currently being used, the CPU 134 selects no error correction algorithm. If the data value (j) is equal to or greater than 5 and equal to or less than 15, the CPU 134 selects the current error correction algorithm. If the data value (j) is greater than 15, the CPU 134 selects the next higher error correction algorithm. In this case, if the low-level error correction algorithm or the high-level error correction algorithm is currently being used, the CPU 134 selects the high-level error correction algorithm, and if no error correction algorithm is currently being used, the CPU 134 selects the low-level error correction algorithm.

In this manner, the CPU 134 maintains the number of defective corrected downlink bearer data packets between a minimum and a maximum threshold, resulting in the employment of an error correction algorithm that maintains the current BLER level at a tolerable level while at the same time not creating excessive overhead. It should be noted that the selection of the error correction algorithm is relative in that the error correction algorithm selected is based on the error correction algorithm currently employed.

During dynamic communication conditions, wherein the quality of the communications channel may vary widely over time, the data value (L) in the multi-frame register 142 is set to a relatively low value, so that the wireless communications system 100 can quickly compensate for the dynamic communication conditions. During stable communication conditions when the quality of the communications channel varies little over time, the data value (L) in the multi-frame register 142 is set to a relatively high value, so that the wireless communications system 100 does not unnecessarily use CPU processing time.

The processor 112 determines the dynamic communication conditions and occasionally adjusts the number of time frames 108 in a given multi-frame 156 by adjusting the data value (L) in the multi-frame register 142. The processor 112 comprises a dynamic incremental register 150, which stores a data value (k) indicating the number of consecutive times the CPU 134 has selected the same error correction algorithm. If the CPU 134 selects the same error correction algorithm in the last time frame 108 of the current multi-frame 156 as that selected by the CPU 134 in the last time frame 108 of the previous multi-frame 156, the CPU 134 increments the data value (k) in the dynamic incremental register by one.

The processor 112 comprises a low stability threshold set register 152 and a high stability threshold set register 154, which respectively store a data value (P) indicating a low stability threshold, and a data value (Q) indicating a high stability threshold. The data value (P) is set by specifying a low stability threshold value equal to the number of consecutive selections of the same error correction algorithm on which selection of either decreasing or maintaining the number of time frames 108 in the next multi-frame 156 (i.e., data value (L)) is based. The data value (Q) is set by specifying a high stability threshold value equal to the number of consecutive selections of the same error correction algorithm on which selection of either maintaining or increasing the number of time frames 108 in the next multi-frame 156 is based. Because data value (Q) represents a higher threshold than does the data value (P), the data value (Q) is greater than the data value (P).

If a different error correction algorithm is selected, the CPU 134 compares the data value (k) with the data value (P) in the low stability threshold set register 152 to determine whether the data value (L) in the multi-frame register 142 should be decreased or maintained. In this case, the data value (k) need not be compared to the data value (Q) in the high stability threshold set register 154, since the necessity to increase the data value (L) would only be triggered by a highly stable communication channel.

If the same error correction algorithm is selected, the CPU 134 compares the data value (k) with the data value (Q) in the high stability threshold set register 152 to determine whether the data value (L) in the multi-frame register 142 should be increased or maintained. In this case, the data value (k) need not be compared to the data value (P) in the low stability threshold set register 154, since the necessity to decrease the data value (L) would only be triggered by a highly dynamic communication channel.

Thus, by way of non-limiting example, if the data value (P) is set to 10, the data value (Q) is set to 30, the data value (L) is decreased if the data value (k) is less than 10 upon selection of a different error correction algorithm, increased if the data value (k) is greater to or equal to 30 upon selection of the same error correction algorithm, and maintained in all other cases.

Alternatively, rather than varying the data value (L) in the multi-frame register 142 based on the number of consecutive times selection of the same error correction algorithm occurs, as described above, variance of the data value (L) can be based on the ratio of the number of times selection of an error correction algorithm was changed or not changed over a set number of multi-frames.

Figure 4B:
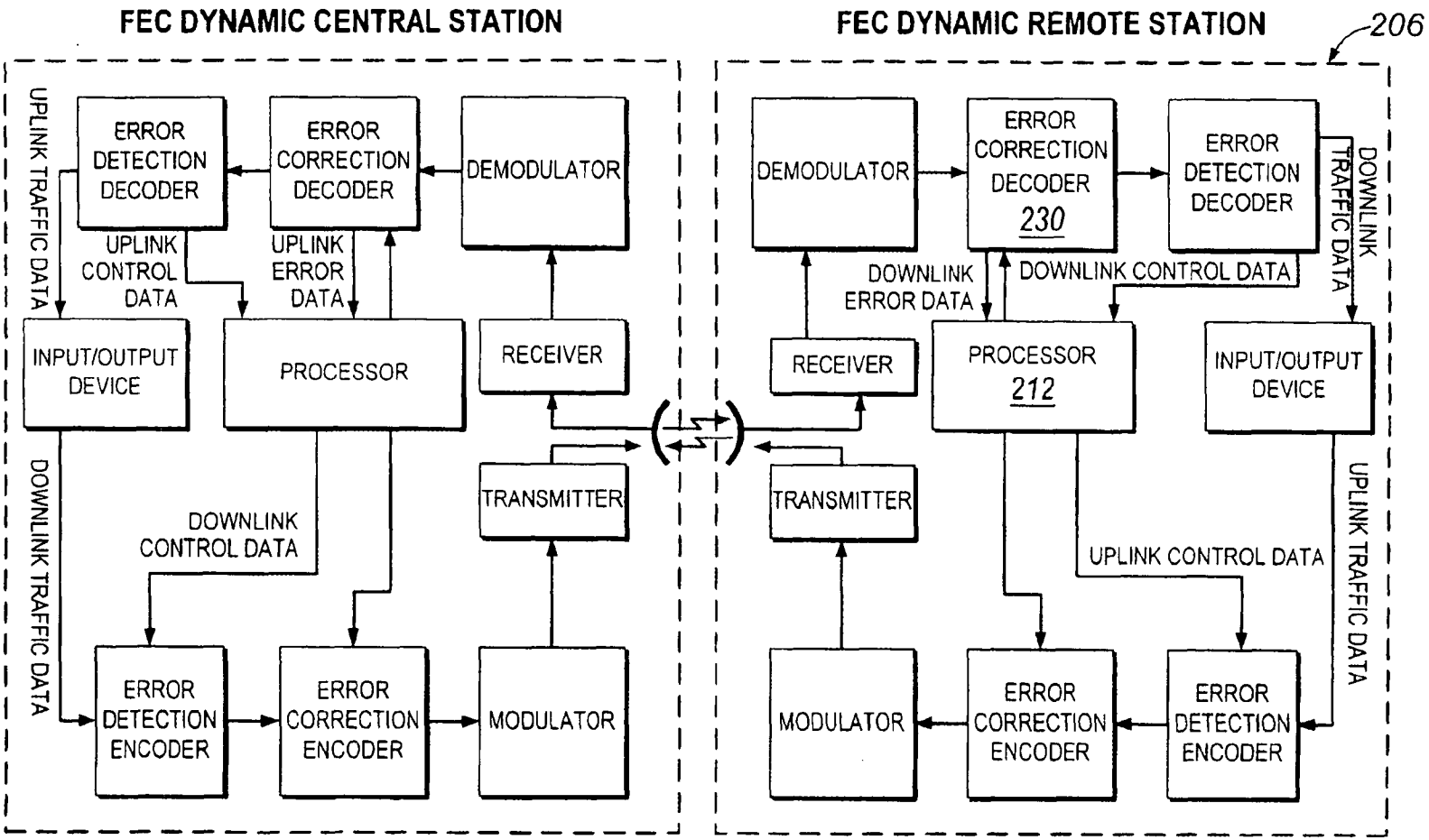
FIG. 4B is a representative block diagram of an alternative embodiment of the FEC dynamic central station and one of the FEC dynamic remote stations.

Referring to FIG. 4B, an alternative embodiment of an FEC dynamic remote station 206 is described. In this embodiment, rather than determining a current BLER level based on the number of defective corrected downlink bearer data packets received by the error detection decoder 132 as previously described, a current bit error rate (BER) level is determined by measuring the number of bit errors in the downlink bearer data packets received by the error correction decoder 130. It should be noted that for purposes of this specification, the current BER level refers to the actual BER or any estimations thereof. The FEC dynamic remote station 206 is similar to the FEC dynamic remote station 106, with the exception that the error correction decoder 130 is electrically coupled to a processor 212 to transfer a control signal thereto indicating the number of bit errors that exist in an uncorrected downlink bearer data packet. In such a case, the error detection encoder 116 and/or error detection decoder 132 is not required for purposes of obtaining the current BLER level, although in some cases, may be required for purposes of indicating to the FEC dynamic remote station 206 or base station 104 (via an ARQ signal) that a defective corrected bearer data packet (i.e., contains a residual error) has been received as described above.

Figure 5B:
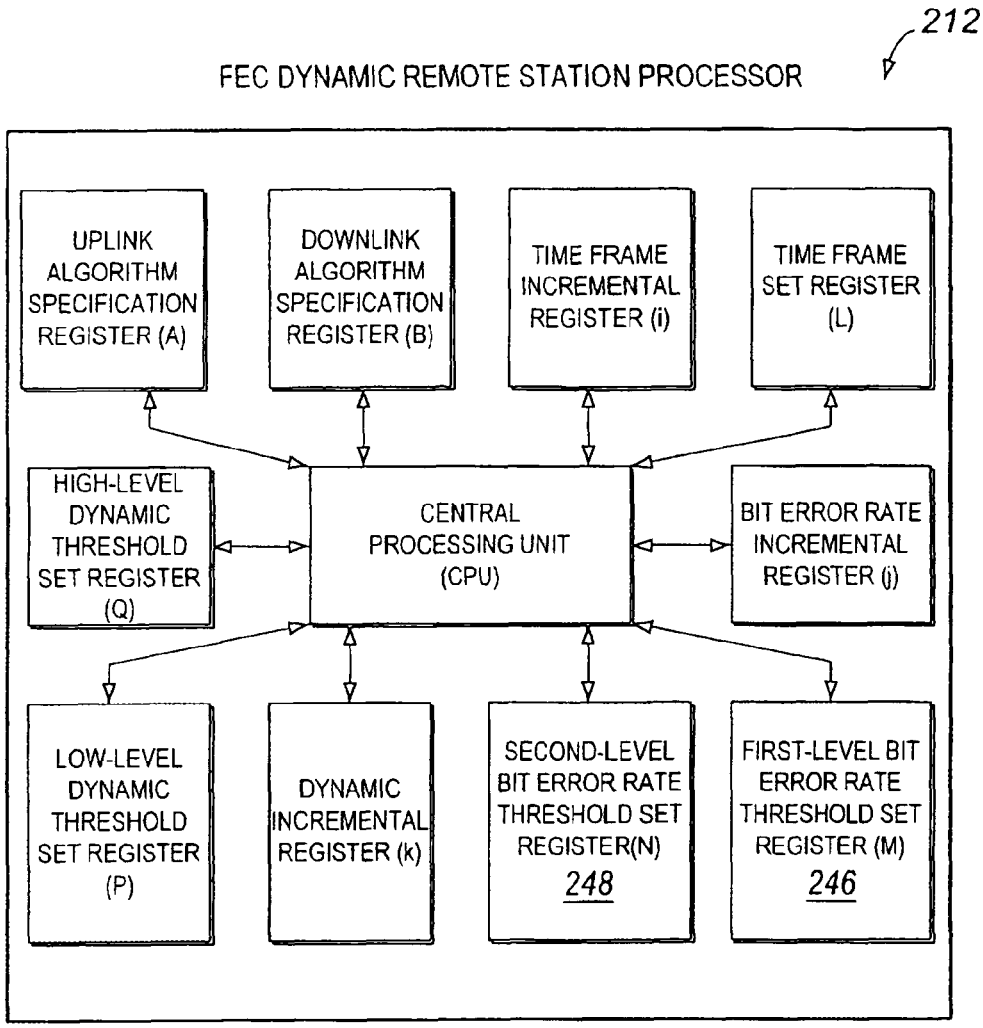
FIG. 5B is a representative block diagram of an alternative embodiment of an FEC dynamic remote station processor.

As depicted in FIG. 5B, the processor 212 is similar to the processor 112, with the exception that, instead of the BLER incremental register 144, minimum BLER threshold set register 146 and maximum BLER threshold set register 148, the processor 212 includes a BER incremental register 244, first-level BER threshold set register 246 and a second-level BER threshold set register 248. The BER incremental register 244 stores a data value (p) equal to the number of bit errors received by the FEC dynamic remote station 204. The current BER level can be determined from data value (p). For each control signal sent from the error correction decoder 130 indicating the number of bit errors in an uncorrected downlink bearer data block, the data value (p) in the BER incremental register 244 is incremented by that number.

The first-level BER threshold set register 246 stores a data value (R) indicating the BER threshold level between selection of no error correction algorithm and the low-level error correction algorithm. The second-level BER threshold set register 248 stores a data value (S) indicating the BER threshold level between selection of the low-level error correction algorithm and the high-level error correction algorithm. Thus, data value (R) and data value (S) are set by defining three ranges of bit error values that will respectively result in the selection of no error correction algorithm, the low-level error correction algorithm, and the high-level error correction algorithm.

The CPU 234 respectively compares the data value (p) in the BER incremental register 244 with the data value (R) in the first-level BER threshold set register 246 and the data value (S) in the second-level BER threshold level to determine which error correction algorithm is selected. For instance, if the data value (R) is set to 20, and the data value (S) is set to 50, the CPU 234 selects no error correction algorithm if the data value (p) is less then 20, the low level error correction algorithm if the data value (p) is equal to or greater than 20 and less than 50, and the high-level error correction algorithm if the data value (p) is equal to or greater than 50.

It should be noted that the number of threshold levels will equal the number of error correction algorithms less one. Thus, if eleven error correction algorithms can be selected, ten threshold levels will be needed to define eleven ranges of detective bit values.

It should also be noted that by measuring the number of defective bits received by the error correction decoder 130, the current BER level can be more accurately obtained. That is, this alternative method takes into account multiple bit errors in each downlink bearer data packet, as well as bit errors that would otherwise not be detected because of correction. Furthermore, because the current BER level is not based on the detection of errors after correction, absolute selection of an error correction algorithm can be accomplished. That is, selection of an error correction algorithm is not based on the error correction algorithm currently employed, facilitating a more flexible error correction algorithm selection process. Thus, the high-level error correction algorithm can be selected even if the error correction algorithm currently used is no error correction algorithm, and vice versa.

The processor 112 comprises other registers, such as registers that store information concerning the time slots 110 during which the FEC dynamic remote station 106 respectively transmits uplink error correctable bearer data packets and receives downlink error correctable bearer data packets, as well as information relating to the FEC dynamic remote stations 106 in current communication with the FEC dynamic central station 104. For purposes of simplicity and ease of illustration, however, discussion of these registers is omitted.

Preferably, the FEC dynamic remote station 106 includes any combination of digitizing, source coding and decoding, interleaving and de-interleaving, burst formatting, or ciphering and de-ciphering functions. For the purposes of simplicity and ease of illustration, however, these functions are not illustrated and described.

Because the dynamic FEC arrangement employed by the wireless communications system 100 is reciprocal, the componentry of the FEC dynamic central station 104 is similar to that of the FEC dynamic remote station 106. That is, as shown in FIG. 4A, the FEC dynamic central station 104, like the FEC dynamic remote station 106, comprises an error detection encoder 116', error correction encoder 118', modulator 120', transmitter 122', and antenna 124', which are all configured and arranged with each other and with the processor 112' and input/output device 114' to facilitate the transmission of error correctable bearer data packets to the FEC dynamic remote station 106. Likewise, the FEC dynamic central station 104 further comprises a receiver 126', demodulator 128', error correction decoder 130', and error detection decoder 132', which are all configured and arranged with each other and with the processor 112', antenna 124' and input/output device 114' to facilitate the reception of error correctable bearer data packets transmitted by the FEC dynamic remote station 106.

Figure 6:
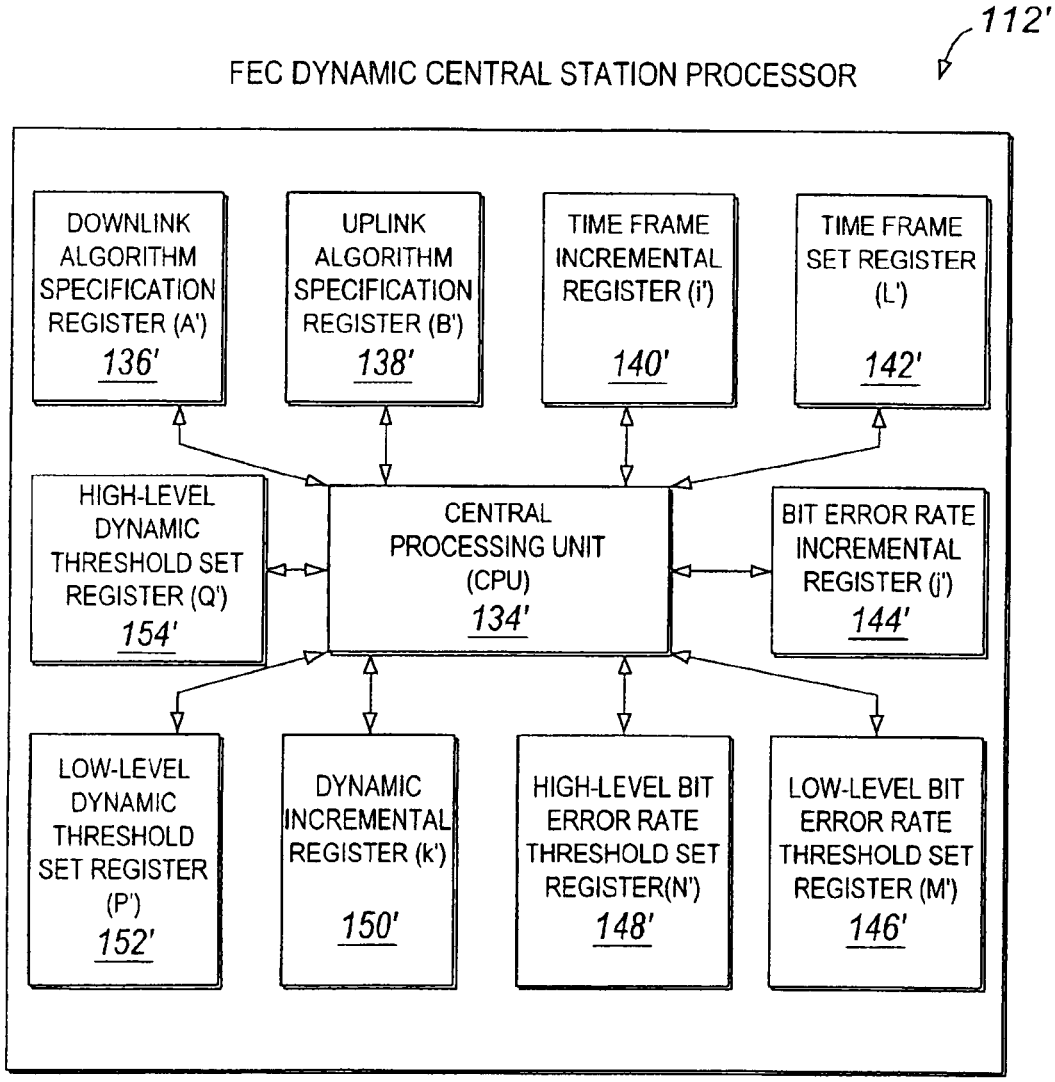
FIG. 6 is a representative block diagram of an FEC dynamic central station processor.

As shown in FIG. 6, the FEC dynamic central station processor 112', like the FEC dynamic remote station processor 112, comprises a CPU 134', which performs all of the processing functions in the FEC dynamic central station 104. The processor 112' further comprises instructions that allow the FEC dynamic remote station 106 to dynamically generate downlink error correctable bearer data packets and dynamically correct uplink error correctable bearer data packets. These instructions are in the form of registers, and in particular a downlink algorithm specification register 136', which stores a data value (A'); uplink algorithm specification register 138', which stores a data value (B'); time frame incremental register 140', which stores a data value (i'); multi-frame register 142', which stores a data value (L'); BLER incremental register 144', which stores a data value (j'); minimum BLER threshold set register 146', which stores a data value (M'), maximum BLER threshold set register 148', which stores a data value (N'); dynamic incremental register 150', which stores a data value (k'); low stability threshold set register 152', which stores a data value (P); and high stability threshold set register 154', which stores a data value (Q)

It should be noted that the processor 112' provides for the measurement of current BLER levels. Quite similarly, but not shown, an FEC dynamic central station processor can be employed for providing the measurement of current BER levels, much like the FEC dynamic remote station processor 212.

It should be further noted that, for purposes of simplicity in describing the principles of this invention, only the componentry in the FEC dynamic central station 104 is necessary to communicate with various FEC dynamic remote stations 106 over a single pair of downlink and uplink frequencies (TDMA/FDD) or a single downlink/uplink frequency pair (TDMA/TDD) is depicted in FIGS. 4A, 4B and 6. In reality, the FEC dynamic central station 104 communicates with a multitude of FEC dynamic remote stations 106 over a range of downlink and uplink frequency pairs or downlink/uplink frequencies and includes other components not employed in the FEC dynamic remote station 104, such as a multiplexer and demultiplexer. Furthermore, the FEC dynamic central station processor 112' includes a number of register sets equal to the system capacity of the wireless communications system 100, i.e., the number of FEC dynamic remote stations 106 that the FEC dynamic central station 104 is able to communicate with.

It should also be noted that the FEC arrangement employed by the FEC dynamic central station 104 is independent from the FEC arrangement employed by the FEC dynamic remote station 106, and thus, the error correction algorithm selected by the FEC dynamic central station 104 processor 112' to append downlink error correctable bearer data packets with error correction data does not necessarily correspond to the error correction algorithm selected by the FEC dynamic remote station processor 112 to append uplink error correctable bearer data packets with error correction data. Also, the present inventions are not limited to those wireless communications systems that employ a bilateral dynamic FEC arrangement as just described, but can also include wireless communications systems that employ a unilateral or asymmetric dynamic FEC arrangement.

The following is a description of the operation of the wireless communications system 100. During the initial handshaking operation between the FEC dynamic central station 104 and the FEC dynamic remote station 106, data concerning the initial particulars of the FEC arrangement of the wireless communications system 100, as well as initiation data, such as identification data, time slot allocation data, and frequency allocation data is communicated between the FEC dynamic central station 104 and the FEC dynamic remote station 106.

If the wireless communications system 100 employs a TDMA/FDD format, the downlink and uplink frequencies are different, and the FEC dynamic remote station 106 transmits and receives error correctable bearer data packets during staggered time slots 110(1) and 110(2) of respective independent time frames 108(1) and 108(2), as depicted in FIG. 2. If the wireless communications system 100 employs a TDMA/TDD format, the downlink and uplink frequencies are the same, and the FEC dynamic remote station 106 transmits and receives error correctable bearer data packets during different time slots 110(3) of the single time frame 108(3), as depicted in FIG. 3. Frequency and time slot assignment is orchestrated by the FEC dynamic central station 104.

After the initial handshaking operations between the FEC dynamic central station 104 and the FEC dynamic remote station 106, the registers of the FEC dynamic central station processor 112' and the FEC dynamic remote station processor 112 are initialized, and downlink error correctable bearer data packets and uplink error correctable bearer data packets are alternately transmitted between the FEC dynamic central station 104 and the FEC dynamic remote station 106.

With respect to the TDMA/FDD formatted system 100, the FEC dynamic central station 104 appends downlink error correctable bearer data packets with error correction data according to a selected error correction algorithm and respectively transmits these error correctable bearer data packets to the FEC dynamic remote station 106 in the respective downlink time frames 108(1) of a downlink multi-frame 156(1). The FEC dynamic remote station 106 corrects the error correctable bearer data packets according to the selected error correction algorithm and determines a current BER level of the downlink communication channel between the FEC dynamic central station 104 and the FEC dynamic remote station 106 during the last downlink time frame 108(1) of the downlink multi-frame 156(1) based on the bearer data received over the entire downlink multi-frame 156(1). The FEC dynamic remote station 106 selects, based on the current BER level, an error correction algorithm to be employed by the FEC dynamic central station 104 and the FEC dynamic remote station 106 to respectively append and correct the downlink error correctable bearer data packets transmitted during the respective downlink time frames 108(1) of the next downlink multi-frame 156(1).

Likewise, the FEC dynamic remote station 106 appends uplink error correctable bearer data packets with error correction data according to a selected error correction algorithm and respectively transmits these error correctable bearer data packets to the FEC dynamic central station 104 in the respective uplink time frames 108(2) of an uplink multi-frame 156 (2). The FEC dynamic central station 104 corrects the error correctable bearer data packets according to the selected error correction algorithm and determines a current BER level of the uplink communications channel between the FEC dynamic central station 104 and the FEC dynamic remote station 106 during the last uplink time frame 108(2) of the uplink multi-frame 156(2) based on the bearer data received over the entire uplink multi-frame 156(2). The FEC dynamic central station 104 selects, based on the current BER level, an error correction algorithm to be employed by the FEC dynamic remote station 106 and the FEC dynamic central station 104 to respectively append and correct the uplink error correctable bearer data packets transmitted during the respective uplink time frames 108(2) of the next uplink multi-frame 156(2).

Figure 8:
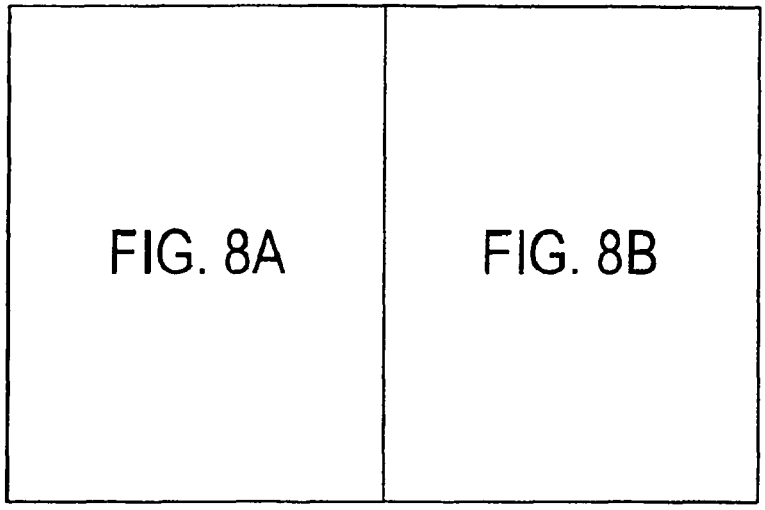
FIG. 8 depicts the arrangement of FIGS. 8A and 8B.

Referring to FIGS. 4-8, and more specifically to FIG. 8, the FEC dynamic central station processor 112' and the FEC dynamic remote station processor 112 perform various steps in effecting the downlink transmission of consecutive error correctable bearer data packets during the respective downlink time frames 108(1) of each downlink multi-frame 156(1) according to the dynamic FEC arrangement of the present invention.

At step 158, the data registers of the FEC dynamic central station processor 112' and FEC dynamic remote station processor 112 are initialized. The data value (A') in the downlink algorithm specification register 136' of the FEC dynamic central station processor 112' and the data value (B) in the downlink algorithm specification register 138 of the FEC dynamic remote station processor 112 are initially both set to "0", "1", or "2" to specify the particular error correction algorithm initially and respectively employed by the FEC dynamic central station 104 to generate error correction data and the FEC dynamic remote station 106 to process and correct the first downlink error correctable bearer data packet. The initial data values (A') and (B) will depend on the particular system requirements.

The data values (i), (j), and (k) in the respective time frame incremental register 140, BLER incremental register 144, and dynamic incremental register 150 of the FEC dynamic remote station processor 112 are initialized to "0". The data value (L) in the multi-frame register 142 is initialized to set the number of time frames 108 in the first multi-frame 156. The data value (M) in the minimum BLER threshold set register 146 and the data value (N) in the maximum BLER threshold set register 148 are initialized to respectively set the minimum BLER threshold level and the maximum BLER threshold level. The data value (P) in the low stability threshold set register 152 and the data value (Q) in the high stability threshold set register 154 are initialized to respectively set the low stability threshold and the high stability threshold. The initial data values (L), (M), (N), (P), and (Q) will vary with the particulars of the wireless communications system 100 and are set accordingly.

At steps 160 to 176, the FEC dynamic central station processor 112' and the FEC dynamic remote station processor 112 respectively configure the error correction encoder '118 and the error detection decoder 132 according to the current error correction algorithm, coordinate the transmission, reception, and correction of respective downlink error correctable bearer data packets during the current multi-frame 156, and select an error correction algorithm to be employed during the next multi-frame 156.

At step 160, the FEC dynamic central station processor 112' configures the error correction encoder 118', so that it employs the particular error correction algorithm specified in the downlink algorithm specification register 136' to generate the error correction data that is to be appended to the current downlink error correctable bearer data packet.The CPU 134' accesses the downlink algorithm specification register 136' to obtain the current data value (A'). If the data value (A') equals "0", the processor 112' sends a control signal to the error correction encoder 118' indicating that no error correction algorithm be employed. If the data value (A') equals "1", the processor 112' sends a control signal to the error correction encoder 118' indicating that the low-level error correction algorithm be employed. If the data value (A') equals any value but "0" or "1", the processor 112' sends a control signal to the error correction encoder 118' indicating that the high-level error correction algorithm be employed.

At step 162, the FEC dynamic remote station processor 112 configures the error correction decoder 130, so that it employs the particular error correction algorithm specified in the downlink algorithm specification register 138 to process and correct the current downlink error correctable bearer data packet. The CPU 134 accesses the downlink algorithm specification register 138 to obtain the current data value (B). If the data value (B) equals "0", the processor 112 sends a control signal to the error correction decoder 130 indicating that no error correction algorithm should be employed. If the data value (B) equals "1", the processor 112 sends a control signal to the error correction decoder 130 indicating that the low-level error correction algorithm should be employed. If the data value (B) equals any value but "0" or "1", the processor 112 sends a control signal to the error correction decoder 130 indicating that the high-level error correction algorithm should be employed. It should be noted that the data value (A') in the downlink algorithm specification register 136' of the FEC dynamic central station processor 112' is equal to the data value (B) in the downlink algorithm specification register 138 of the FEC dynamic remote station processor 112, since the error correction encoder 118' of the FEC dynamic central station 104 and the error correction decoder 130 of the FEC dynamic remote station 106 employ the same error correction algorithm to respectively generate error correction data and correct the downlink error correctable bearer data packet.

At step 164, the FEC dynamic central station processor 112' directs the FEC dynamic central station 104 to transmit a downlink error correctable bearer data packet during a time slot 110(1) of the current downlink time frame 108(1) which the FEC dynamic remote station 106 is designated to receive an error correctable downlink bearer data packet (shown as time slot 3 in FIG. 7).

If an Automatic Retry Request (ARQ) signal transmitted by the FEC dynamic remote station 106 indicating the receipt of a previously transmitted defective corrected bearer data packet, as described further below, was not received by the FEC dynamic central station 104, the FEC dynamic central station processor 112' directs the input/output device 114' electrically coupled to the FEC dynamic central station 104 to transfer downlink traffic data to the error detection encoder 116' as a downlink bearer data packet. The amount of downlink traffic data transferred to the error detection encoder 116' will depend on the particular error correction algorithm employed by the error correction encoder 118'. That is, the processor 112' directs the input/output device 114' to increase the amount of downlink traffic data transferred as error correction data overhead decreases. Contrariwise, the processor 112' directs the input/output device 114' to decrease the amount of downlink traffic data transferred as the error correction data overhead increases. The processor 112' then transfers downlink control data to the error detection encoder 116' where it is appended to the downlink bearer data packet. The error detection encoder 116' generates error detection data according to the CRC error detection algorithm and appends the downlink bearer data packet with the generated error detection data. The error detection encoder 116' then transfers the downlink bearer data packet to the error correction encoder 118'. The error correction encoder 118' then encodes the downlink bearer data packet with error correction data according to the error correction algorithm specified by the processor 112' to form an error correctable downlink bearer data packet.

If an ARQ signal was received, the FEC dynamic central station processor 112' directs the input/output device 114' to not transfer downlink traffic data to the error correction encoder 118'. Instead, the previous downlink error correctable bearer data packet stored in the error correction encoder is re-transmitted as the current downlink error correctable bearer data packet.

The downlink error correctable bearer data packet is then transferred to the modulator 120' and transmitter 112', where it is respectively modulated with a downlink carrier frequency, and amplified and filtered. The downlink error correctable bearer data packet is then transferred to the antenna 124', where it is transmitted over-the-air to the antenna 124 of the FEC dynamic remote station 106.

At step 166, the FEC dynamic remote station processor 112 directs the FEC dynamic remote station 106 to receive the downlink error correctable bearer data packet transmitted over-the-air from the FEC dynamic central station 104 during the downlink time slot 110(1) of the current downlink time frame 108(1). The downlink error correctable bearer data packet is received by the antenna 124, and transferred to the receiver 126 and the demodulator 128, where it is respectively filtered and demodulated from the carrier frequency. The downlink error correctable bearer data packet is then transferred to the error correction decoder 130. The error correction decoder 130 then processes and corrects, within the limits of the error correction algorithm specified by the processor 112, the downlink error correctable bearer data packet to generate a corrected downlink bearer data packet. The corrected downlink bearer data packet is then transferred to the error detection decoder 132, where it is processed to determine the existence of any residual errors.

At step 168, the FEC dynamic remote station processor 112 remedies any residual errors in the corrected bearer data packet. If the error detection decoder 132 does not sense a residual error in the corrected downlink bearer data packet, the error detection decoder 132 sends a control signal to the processor 112 indicating that the error detection decoder 132 currently possesses a valid downlink bearer data packet. The downlink control data is then separated from the corrected downlink bearer data packet. The valid downlink bearer data packet is transferred to the input/output device 114 electrically coupled to the FEC dynamic remote station 106 as downlink traffic data. The downlink control data originating from the FEC dynamic central station 104 is transferred to the processor 112, where it is accordingly processed. In response to no residual errors in the corrected downlink bearer data packet, the CPU 134 increments by one the data value (i) in the time frame incremental register 140.

If the error detection decoder 132 senses at least one residual error in the corrected downlink bearer data packet, the error detection decoder 132 sends a control signal to the processor 112 indicating that the error detection decoder 132 currently possesses a defective corrected downlink bearer data packet.

If the input/output device 114 is not delay-sensitive, such as, e.g., a PC, the defective corrected downlink bearer data packet is not transferred to the input/output device 114. Instead, the FEC dynamic remote station processor 112 directs the FEC dynamic remote station 106 to transmit an ARQ control signal during the next available control time slot.

If the input/output device 114 is delay-sensitive, such as, e.g., a voice encoder/decoder, the downlink control data is separated from the corrected downlink bearer data packet. The defective corrected downlink bearer data packet is transferred to the input/output device 114 electrically coupled to the FEC dynamic remote station 106 as downlink traffic data. The processor 112, however, will send a control signal to the input/output device 114 indicating the existence of defective downlink traffic data. The input/output device 114 then processes the downlink traffic data accordingly. The downlink control data originating from the FEC dynamic central station 104 is transferred to the processor 112, where it is accordingly processed. In response to an indicated defective corrected bearer data packet, the CPU 134 increments by one, both the data value (i) in the time frame incremental register 140 and the data value (j) in the BLER incremental register 144.

At step 170, the FEC dynamic remote station processor 112 determines whether the current downlink time frame 108(1) is the last time frame in the current downlink multi-frame 156(1). That is, the FEC dynamic remote station processor 112 determines whether the next error correction algorithm should currently be selected. The CPU 134 accesses the time frame incremental register 140 to obtain the data value (i), and thus, the current downlink time frame 108(1). The CPU 134 also accesses the multi-frame register 144 to obtain the data value (L), and thus the number of downlink time frames 108(1) in the current multi-frame 156(1). The CPU 134 compares the data value (i) with the data value (L). If the data value (i) does not equal the data value (L), the wireless communications system 100 goes to step 164 whereat the FEC dynamic central station processor 112' directs the FEC dynamic central station 104 to transmit the next downlink error correctable bearer data packet during the next downlink time frame 108(1) of the current downlink multi-frame 156 (1).

If the data value (i) equals the data value (L), the FEC dynamic remote station processor 106 selects, at step 172, the particular error correction algorithm to be employed by the error correction encoder 118' of the FEC dynamic central station 104 and the error correction decoder 130 of the FEC dynamic remote station 106 to respectively generate error correction data and correct the error correctable bearer data packets transmitted during the downlink time frames 108(1) of the next downlink multi-frame 156(1).

At step 172, if the current BLER level does not trigger the minimum BLER threshold or the maximum BLER threshold, the current error correction algorithm employed is selected. If the current BLER level triggers the minimum BLER threshold, the next lower error correction algorithm is selected. If the current BLER level triggers the maximum BLER threshold, the next higher error correction algorithm is selected.

In this manner, the CPU 134 determines a current BLER level by accessing the BLER incremental register 144 to obtain the current data value (j), and determines a minimum BLER threshold level by accessing the minimum BLER threshold set register 146 to obtain the current data value (M). The CPU 134 compares the data value (j) to the data value (M). If the data value (j) is less than the data value (M), the CPU 134 accesses the downlink algorithm specification register 138 to obtain the current data value (B), and thus the current error correction algorithm. If the current data value (B) is less than or equal to "1", the CPU 134 selects the data value (B) as "0", indicating no error correction algorithm should be selected. If the current value (B) is greater than "1", the CPU 34 selects the data value (B) as 1, indicating that the low-level error correction algorithm should be selected.

If the data value (j) is greater than or equal to the data value (M), the CPU 134 determines the maximum BLER threshold by accessing the maximum BLER threshold set register 148 to obtain the current data value (N). The CPU 134 compares the data value (j) to the data value (N). If the data value (j) is greater than the data value (N), the CPU 134 accesses the downlink algorithm specification register 138 to obtain the current data value (B), and thus the current error correction algorithm. If the current data value (B) equals "0", the CPU 134 selects the data value (B) as "1", indicating the low-level error correction algorithm. If the current data value (B) does not equal "0", the CPU 134 selects the data value (B) as "2", indicating the high-level error correction algorithm.

If the data value (j) is not greater than the data value (N), the CPU 134 does not select a value for the data value (B), indicating that the current error correction algorithm should be maintained. The CPU 134 then increments the data value (k) in the dynamic incremental register 150 indicating that a new error correction algorithm has not been selected, i.e., the currently selected data value (B) is equal to the previously selected data value (B). As will be described in further detail below, the data value (B) is not reset until approved by the central station 104.

Subsequent to proposed selection of the error correction algorithm, the CPU 134 resets the data value (i) in the time frame incremental register 140 to "0" and the data value (j) in the BLER incremental register 144 to "0", so that they are initialized for the next multi-frame 156.

At step 174, the FEC dynamic remote station processor 112 determines whether the data value (L) in the multi-frame register 142, and thus the number of downlink time frames 108(1) in the next downlink multi-frame 156(1), should be changed with respect to the stability of the communication channel quality.

If the data value (k) in the dynamic incremental register 150 at step 172 was not incremented indicating a change in the selection of the error correction algorithm, the FEC dynamic remote station processor 212 determines whether the number of downlink time frames 108(1) in the next downlink multi-frame 156(1) should be decreased or maintained. The CPU 134 determines the number of consecutive times the same error correction algorithm has been selected by accessing the dynamic incremental register 150 to obtain the data value (k). The CPU 134 also determines the low stability threshold value by accessing the low stability threshold set register 152 to obtain the data value (P). The CPU 134 compares the data value (k) with the data value (P). If the data value (k) is less than the data value (P), the CPU 134 decrements the data value (L) in the multi-frame register 142 by a particular number, decreasing the number of time frames 108 in the next multi-frame 156. If the data value (k) is not less than the data value (P), the CPU 134 does not change the data value (L) in the multi-frame register 142, maintaining the number of time frames 108 in the next multi-frame 156. Whether the data value (L) is decremented or maintained,. the CPU 134 resets the data value (k) to "0", so that the stability of the communication channel quality can be redetermined.

If the data value (k) in the dynamic incremental register 150 at step 172 has been incremented indicating no change in the error correction algorithm, the FEC dynamic remote station processor 212 determines whether the number of downlink time frames 108(1) in the next downlink multi-frame 156(1) should be increased or maintained. The CPU 134 determines the number of consecutive times the same error correction algorithm has been selected by accessing the dynamic incremental register 150 to obtain the current data value (k). The CPU 134 also determines the high stability threshold value by accessing the high stability threshold set register 154 to obtain the data value (Q). The CPU 134 compares the data value (k) to the data value (Q). If the data value (k) is equal to or greater than the data value (Q), the CPU 134 increments the data value (L) in the multi-frame register 142 by a particular number, increasing the number of time frames 108 in the next multi-frame 156. The CPU 134 resets the data value (k) to "0", so that the stability of the communication channel quality can be redetermined. If the data value (k) is less than the data value (Q), the CPU 134 does not change the data value (L), maintaining the number of downlink time frames 108(1) in the next downlink multi-frame 156(1) to its current value. The CPU 134 does not reset the data value (k), so that the current number of consecutive times the same error correction algorithm has been selected is taken into account during the next determination of the stability of the communication channel quality.

At step 176, the FEC dynamic remote station 106 transmits uplink control data to the FEC dynamic central station 104 during the next available control time slot. The uplink control data indicates the error correction algorithm selected by the FEC dynamic remote station 106, the next downlink time frame 108(1) during which the FEC dynamic remote station 106 selects an error correction algorithm, and if applicable, an ARQ signal indicating the receipt of a defective corrected downlink bearer data packet as described above.

The FEC dynamic central station 104 receives the uplink error correctable bearer data packet from the FEC dynamic remote station 106 and processes the uplink control data. The FEC dynamic central station 104 transmits downlink control data to the FEC dynamic remote station 106 during the next available downlink control time slot. The downlink control data indicates whether the error correction algorithm selection is approved or denied. If the FEC dynamic central station processor 112' determines that the selected error correction algorithm should be employed, the downlink control data indicates approval of the selected error correction algorithm. On the other hand, if the FEC dynamic central station processor 112' determines that the selected error correction algorithm should not be employed, such as, if the selected error correction algorithm is not compatible with the wireless communication system 100 or the available overhead or central station does not support the error correction algorithm, the downlink control data indicates denial of the selected error correction algorithm.

The FEC dynamic remote station 106 receives the downlink control data, and accordingly either resets the data value (B) of the downlink algorithm specification register 138 to the selected data value (B) if the selected error correction algorithm was approved by the FEC dynamic central station processor 212', or does not reset the data value (B) of the downlink algorithm specification register 138 to the selected data value (B), if the selected error correction algorithm was denied by the FEC dynamic central station processor 212'.

The FEC dynamic central station processor 112', in turn, resets the data value (A') in the downlink algorithm specification register 136' equal to the data value (B).

Rather than synchronizing the error correction algorithm used by the central station 104 and remote station 106 to respectively encode and process a downlink bearer data packet by sending a confirmation or denial signal during a dedicated control time slot as described above with respect to step 176, synchronization of the error correction algorithm can be accomplished by encoding each downlink bearer data packet with a highly protected code word indicating the error correction algorithm that was employed to encode the particular downlink bearer data packet with error correction data. During processing of the downlink bearer data packet, the remote station 106 can decode the code word to determine the error correction algorithm to be employed to process the downlink bearer data packet. More alternatively, the remote station 106 can process the downlink bearer data packet with all available error correction algorithms, and use the best corrected bearer data packet.

After synchronization of the error correction algorithm, the wireless communications system 100 then returns to steps 160 and 162 where the error correction encoder 118' of the FEC dynamic central station 104 and the error correction decoder 118 of the FEC dynamic remote station 106 are configured to employ the particular error correction algorithm as specified by the data value (A') and data value (B).

If an error correction algorithm was selected at step 172, and thus, the data value (i) in the time frame incremental register 140 was reset to "0", the next downlink error correctable bearer data packet transmitted by the FEC dynamic central station 104 and received by the FEC dynamic remote station 106 will occur during the first time frame 108 of the next multi-frame 156. Contrariwise, if an error correction algorithm was not selected at step 172, and thus, the data value (i) in the time frame incremental register 140 was not reset to "0", the next downlink error correctable bearer data packet transmitted by the FEC dynamic central station 104 and received by the FEC dynamic remote station 106 will occur during the next downlink time frame 108(1) of the current downlink multi-frame 156(1).

The steps performed by the FEC dynamic central station processor 112' and the FEC dynamic remote station processor 112, in effecting the uplink transmission of consecutive error correctable bearer data packets according to the dynamic FEC arrangement of the present invention, are reciprocal to and independent of those described above, with respect to the downlink transmission of consecutive error correctable bearer data packets. For purposes of simplicity and terseness, these steps will not be described.

Figure 9:
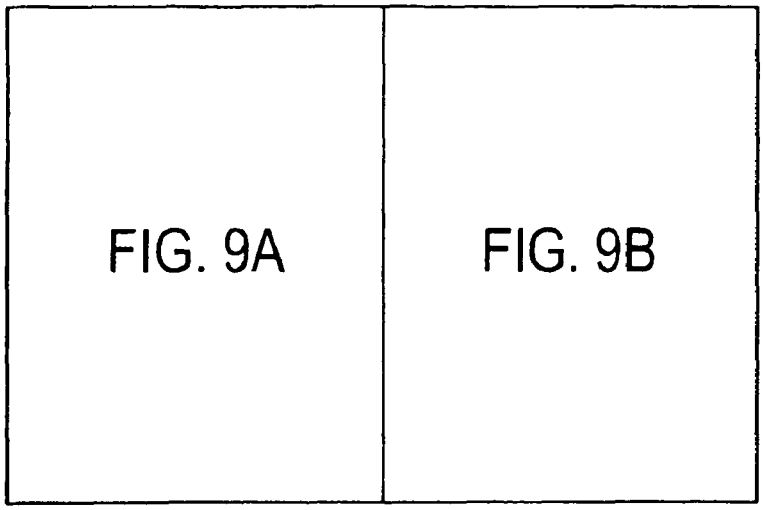
FIG. 9 depicts the arrangement of FIGS. 9A and 9B.
Figure 8A:
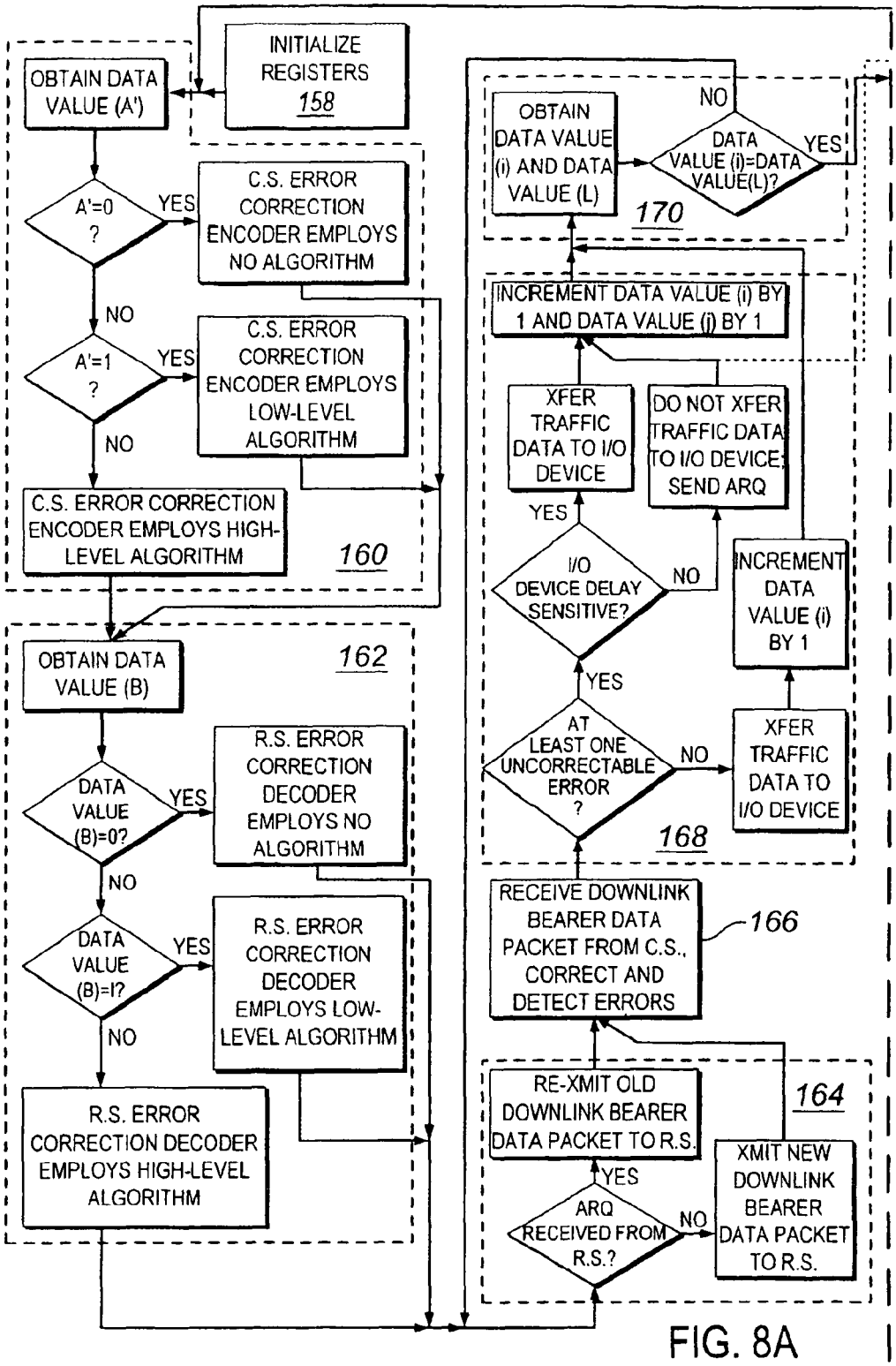
FIGS. 8A and 8B are flow diagram illustrating a protocol for dynamically selecting an error correction algorithm.
Figure 8B:
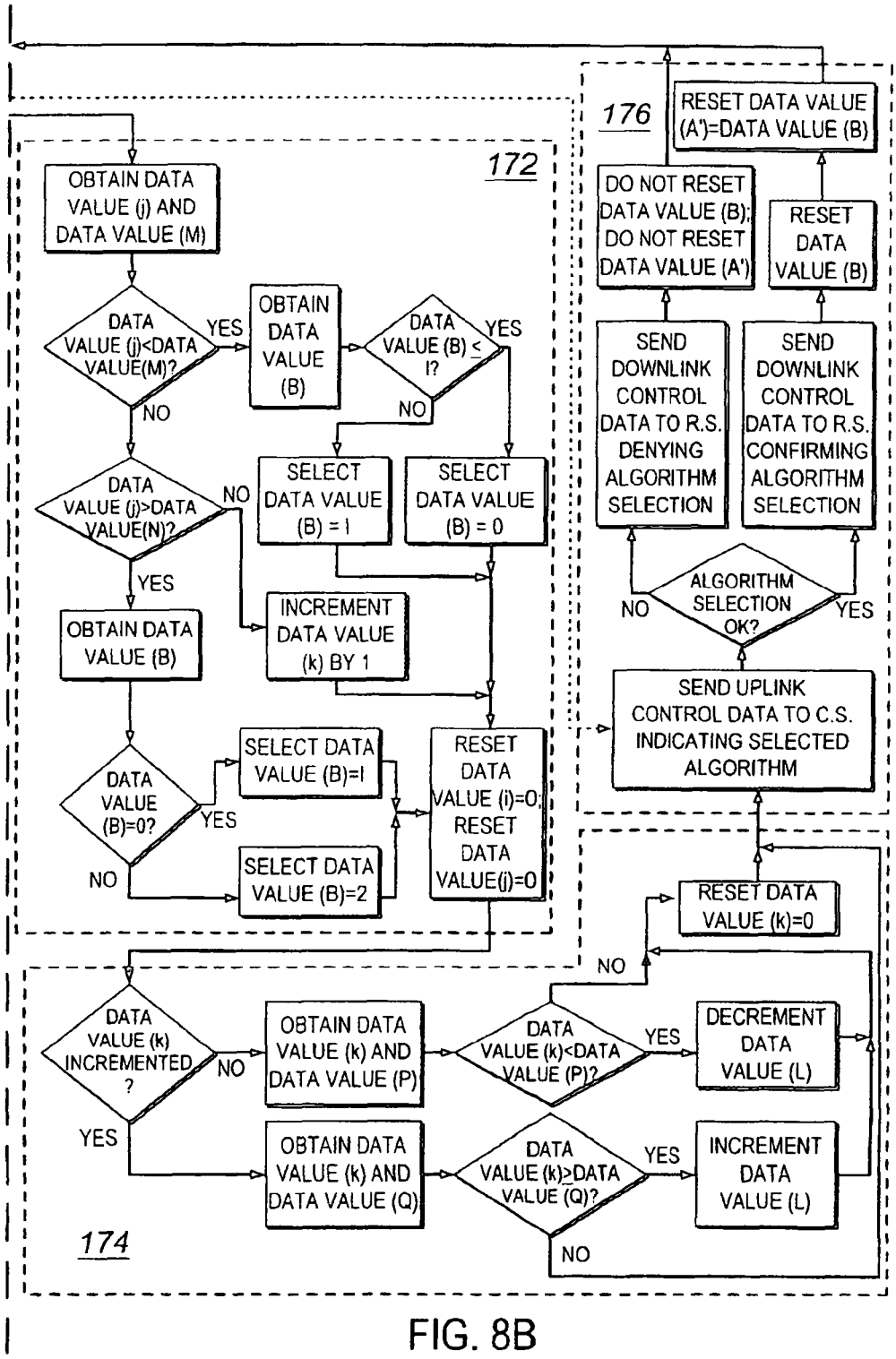
Figure 9A:
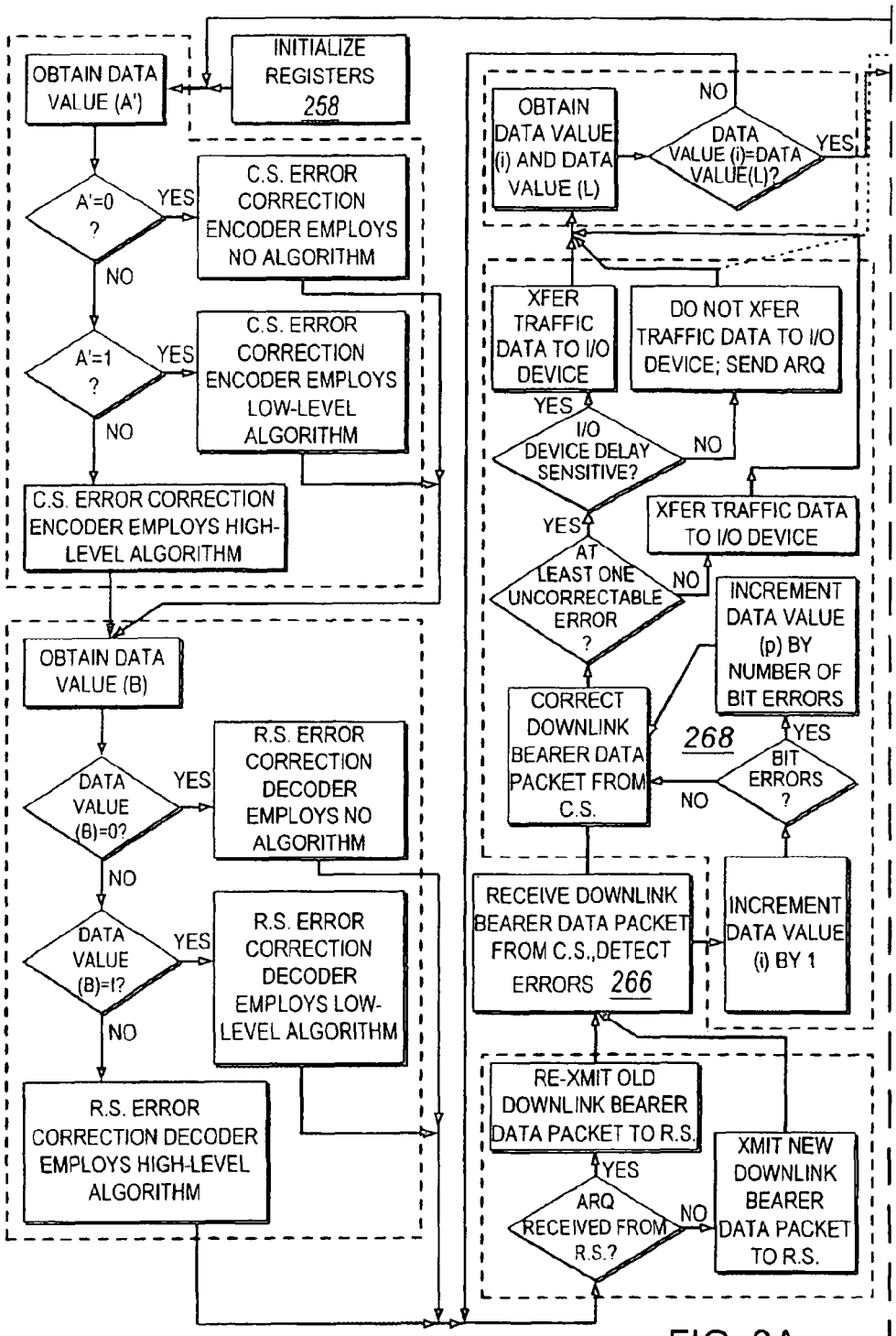
FIGS. 9A and 9B are flow diagram illustrating an alternative protocol for dynamically selecting an error correction algorithm.
Figure 9B:
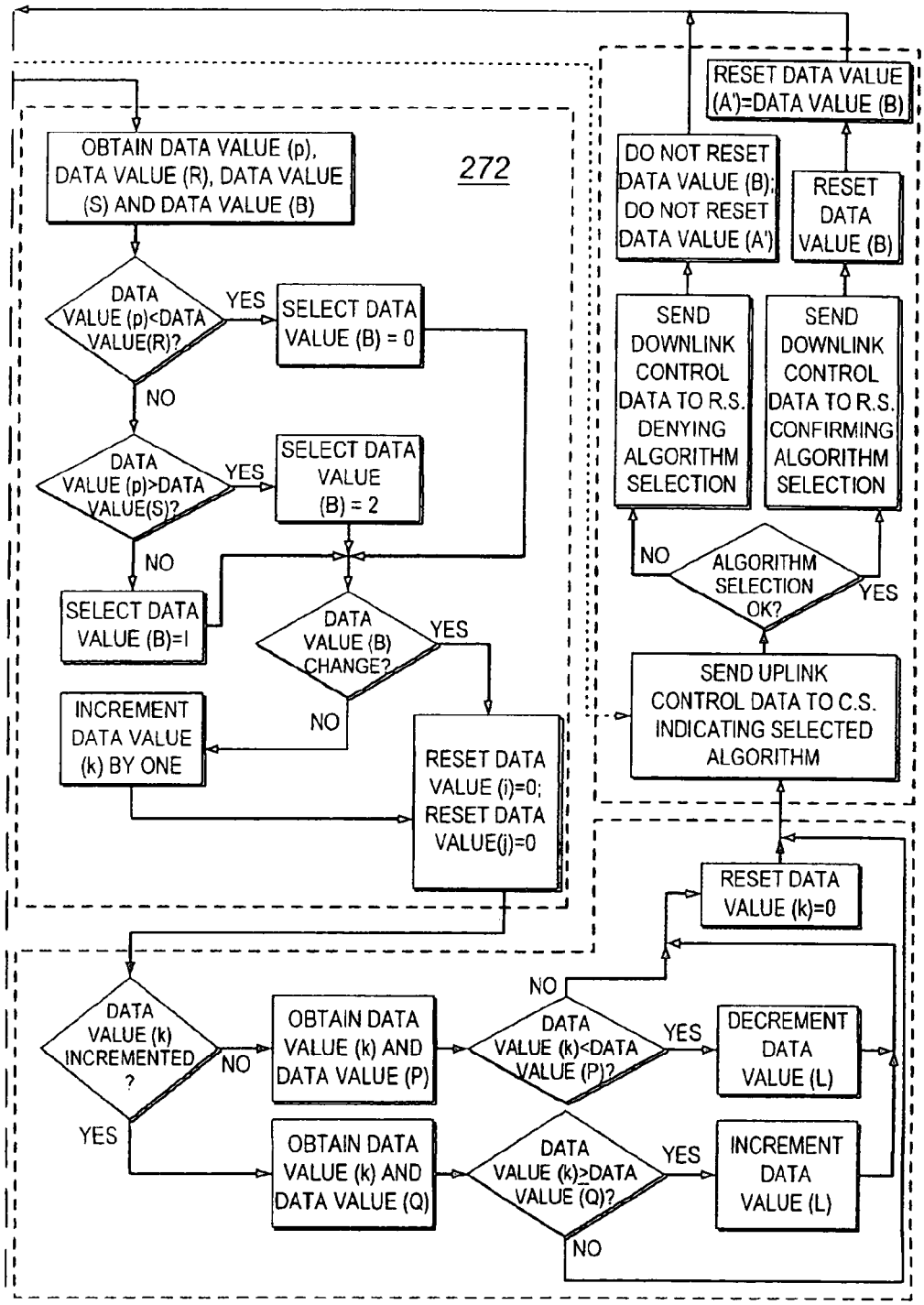

If the current BER level, rather than the current BLER is obtained, steps 258, 266, 268 and 272 (FIG. 9) are performed in place of steps 158, 166, 168 and 172. Step 258 is similar to step 158 with the exception that, rather than initializing the minimum-level BLER threshold set register 146 and the maximum-level BLER threshold set register 148, the data value (R) in the first-level BER threshold set register 246 and the data value (S) in the second level BLER threshold set register 248 are initialized to respectively set the first-level BER threshold level and the second-level BER threshold level.

Step 266 is similar to step 166 with the exception that the error correction decoder 130, rather than the error detection decoder 132, is employed to measure the current BER level rather than the current BLER level. That is, prior to correcting a downlink bearer data packet, the error correction decoder 130 measures the bit errors in the downlink bearer data packet and sends a corresponding control signal to the processor indicating the existence and number of bit errors in the downlink bearer data packet.

Step 268 is similar to step 168 with the exception that the total number of errors in each uncorrected downlink bearer data packet are tracked (i.e., the current BER is measured), rather than the existence of a defective corrected downlink bearer data packet (i.e., the current BLER is measured). That is, if the error correction decoder 130 receives a downlink bearer data packet with no bit errors, the error correction decoder 130 sends a control signal to the processor 112 indicating that the error correction decoder 130 possesses a downlink bearer data packet with no bit errors. If the error correction decoder 130 receives a downlink bearer data packet with at least one error, the error correction decoder 130 sends a control signal to the processor 112 indicating the existence and number of bit errors in the downlink bearer data packet. The CPU 234 increments the data value (p) in the BER incremental register 244 by the number of bit errors detected. The downlink bearer data packet is then corrected and processed as described above.

Step 272 is similar to step 172, with the exception that absolute selection, rather than relative selection, of the error correction algorithm is performed. If the current BER level falls within the range below the first-level threshold, no error correction algorithm is selected. If the current BER level falls within the range between the first-level threshold and the second-level threshold, the low-level error correction algorithm is selected. If the current BER level falls within the range above the second-level threshold, the high-level error correction algorithm is selected.

Thus, the CPU 234 determines a current BER level by accessing the BER incremental register 244 to obtain the current data value (p), and determines a first-level BER threshold level by accessing the first-level BER threshold set register 246 to obtain the current data value (R) and a second-level BER threshold level by accessing the second-level BER threshold set register 248 to obtain the current data value (S). The CPU 234 compares the data value (p) to the data values (R) and (S). If the data value (p) is less than the data value (R), the CPU 234 selects the data value (B) as "0", indicating that the no error correction algorithm should be selected. If the data value (p) is equal to or greater than the data value (S), the CPU 234 selects the data value (B) as "2", indicating that the high-level error correction algorithm should be selected. In all other cases, the CPU 234 selects the data value (B) as "1", indicating that the low-level error correction algorithm should be selected. If data value (B) has changed, the CPU 234 does not increment the data value (k). If data value (B) has not changed, the CPU 234 increments by one the data value (k).

Subsequent to the proposed selection of the error correction algorithm, the CPU 234 resets the data value (i) in the time frame incremental register 140 to "0" and the data value (p) in the BER incremental register 244 to "0", so that they are initialized for the next multi-frame 156.

Operation of the wireless communications system 100 in the TDMA/TDD format is similar to that described above with respect to the TDMA/FDD format, with the exception that the reciprocal error correctable bearer data packet transmissions between the FEC dynamic central station 104 and the FEC dynamic remote station 106 occur during the same downlink/uplink time frame 108(3), i.e., same frequency.

The present inventions are not limited to the wireless communication system disclosed above and may include other types of wireless communications systems, such as, e.g., satellite based communications systems, or other types of wire-based systems, such as, e.g., LAN systems or fiber optic networks.

The present inventions can be used in an out-of-band FEC system, wherein error correction data is transmitted and received in out-of-band time slots, as described in further detail in copending application Ser. No. 09/314,580 filed concurrently herewith, which is fully and expressly incorporated herein by reference.

Thus, an improved apparatus and method for improving the data throughput of a communications system is disclosed. While embodiments and applications of this invention have been shown and described, it would be apparent to those skilled in the art that many more modifications are possible without departing from the inventive concepts herein.

The invention, therefore is not to be restricted except in the spirit of the appended claims.

What is claimed:

1. A method of selecting an error correction algorithm in a communications system, the method comprising:

dividing each time frame of a multi-frame into a plurality of time slots;

determining an error rate level of a communication channel based on a plurality of bearer data packets when received during said multi-frame;

selecting an error correction algorithm from a plurality of error correction algorithms taking into account said error rate level;

determining the dynamic quality of said communication channel; and adjusting the number of time frames in a multi-frame based on said dynamic quality.

2. The method of claim 1, wherein said plurality of bearer data packets comprises traffic data.

3. The method of claim 2, wherein said *selected* error correction algorithm has an overhead level, and wherein the amount of said traffic data is inversely varied with said overhead.

4. The method of claim 1, [and] wherein said error rate level determination comprises correcting said plurality of bearer data packets and detecting a number of defective bearer data packets to obtain a current block error rate (BLER) level, and wherein said error correction algorithm determination is based on said current BLER level.

5. The method of claim 4, wherein said error correction algorithm selection comprises setting a minimum BLER threshold level and a maximum BLER threshold level to create an acceptable BLER range, selecting a current error correction algorithm if said acceptable BLER range includes said current BLER level and selecting an error correction algorithm different from said current error correction algorithm if said acceptable BLER range does not include said current BLER level.

6. The method of claim 5, wherein said plurality of error correction [algorithm comprise] *algorithms comprises* differing overhead levels, and said error correction algorithm determination further comprises selecting an error correction algorithm with a next lower overhead than that of said current error correction algorithm if said current BLER level is below said minimum BLER threshold level and selecting an error correction algorithm with a next higher overhead than that of said current error correction algorithm if said current BLER level is above said maximum BLER threshold level.

7. The method of claim 1, wherein said error rate level determination comprises detecting a number of bit errors in said plurality of bearer data packets to obtain a bit error rate (BER) level, and wherein said error rate level determination is based on said current BER level.

8. The method of claim 7, wherein said error correction algorithm selection comprises setting at least one BER threshold level to create a plurality of BER ranges corresponding to the plurality of error correction [algorithmns] *algorithms*, and selecting an error correction algorithm that corresponds to the BER range that includes the current BER level.

9. The method of claim 1, wherein each bearer data packet of said plurality of bearer data packets is respectively received during a time slot of said each time frame of said multi-frame, and wherein said error correction algorithm selection comprises selecting said error correction algorithm during the last time frame of said multi-frame.

10. The method of claim 1, wherein said plurality of error correction algorithms includes an algorithm which, when used, does not *by itself* correct any errors.

11. The method of claim 1, wherein said plurality of error correction algorithms includes an algorithm which, when used, does not *by itself* correct any errors, a low-level error correction algorithm and a high-level error correction algorithm.

12. The method of claim 1, wherein said plurality of bearer data packets are wirelessly transmitted between a central station and a remote station.

*13. An article, comprising:*

*a non-transitory processor accessible medium having stored thereon instructions that, when executed by a processor, result in selecting an error correction algorithm in a communications system by:*

*dividing each time frame of a multi-frame into a plurality of time slots;*

*determining an error rate level of a communication channel based on a plurality of bearer data packets when received during said multi-frame;*

*selecting an error correction algorithm from a plurality of error correction algorithms taking into account said error rate level;*

*determining the dynamic quality of said communication channel; and*

*adjusting the number of time frames in a multi-frame based on said dynamic quality.*

*14. The article of claim 13, wherein each bearer data packet of said plurality of bearer data packets is respectively received during a time slot of said each time frame of said multi-frame, and wherein said error correction algorithm selection comprises selecting said error correction algorithm during the last time frame of said multi-frame.*

*15. The article of claim 13, wherein said plurality of error correction algorithms includes an algorithm which, when used, does not by itself correct any errors.*

*16. The article of claim 13, wherein said plurality of error correction algorithms includes an algorithm which, when used, does not correct any errors, a low-level error correction algorithm and a high-level error correction algorithm.*

*17. The article of claim 13, wherein said plurality of bearer data packets are wirelessly transmitted between a central station and a remote station.*

*18. The article of claim 13, wherein said plurality of bearer data packets comprises traffic data.*

*19. The article of claim 18, wherein said selected error correction algorithm has an overhead level, and wherein the amount of said traffic data is inversely varied with said overhead.*

*20. The article of claim 13, wherein said error rate level determination comprises detecting a number of bit errors in*

*said plurality of bearer data packets to obtain a bit error rate (BER) level, and wherein said error rate level determination is based on said current BER level.*

*21. The article of claim 20, wherein said error correction algorithm selection comprises setting at least one BER threshold level to create a plurality of BER ranges corresponding to the plurality of error correction algorithms, and selecting an error correction algorithm that corresponds the BER range that includes the current BER level.*

*22. The article of claim 13, wherein said error rate level determination comprises correcting said plurality of bearer data packets and detecting a number of defective bearer data packets to obtain a current block error rate (BLER) level, and wherein said error correction algorithm determination is based on said current BLER level.*

*23. The article of claim 22, wherein said error correction algorithm selection comprises setting a minimum BLER threshold level and a maximum BLER threshold level to create an acceptable BLER range, selecting a current error correction algorithm if said acceptable BLER range includes said current BLER level and selecting an error correction algorithm different from said current error correction algorithm if said acceptable BLER range does not include said current BLER level.*

*24. The article of claim 23, wherein said plurality of error correction algorithms comprises differing overhead levels, and said error correction algorithm determination further comprises selecting an error correction algorithm with a next lower overhead than that of said current error correction algorithm if said current BLER level is below said minimum BLER threshold level and selecting an error correction algorithm with a next higher overhead than that of said current error correction algorithm if said current BLER level is above said maximum BLER threshold level.*

*25. An apparatus, comprising:*

*a receiver to receive bearer data packets; and*

*a processor to determine an error rate level of a communication channel based on a plurality of bearer data packets when received by said receiver during a multi-frame divided into a plurality of time slots, wherein said processor selects an error correction algorithm from a plurality of error correction algorithms taking into account said error rate level, determines the dynamic quality of said communication channel, and adjusts the number of time frames in a multi-frame based on said dynamic quality.*

*26. The apparatus of claim 25, wherein each bearer data packet of said plurality of bearer data packets is respectively received during a time slot of said each time frame of said multi-frame, and wherein said error correction algorithm selection comprises selecting said error correction algorithm during the last time frame of said multi-frame.*

*27. The apparatus of claim 25, wherein said plurality of error correction algorithms includes an algorithm which, when used, does not by itself correct any errors.*

*28. The apparatus of claim 25, wherein said plurality of error correction algorithms includes an algorithm which, when used, does not by itself correct any errors, a low-level error correction algorithm and a high-level error correction algorithm.*

*29. The apparatus of claim 25, wherein said plurality of bearer data packets are wirelessly transmitted between a central station and a remote station.*

*30. The apparatus of claim 25, wherein said plurality of bearer data packets comprises traffic data.*

*31. The apparatus of claim 30, wherein said selected error correction algorithm has an overhead level, and wherein the amount of said traffic data is inversely varied with said overhead.*

*32. The apparatus of claim 25, wherein said error rate level determination comprises detecting a number of bit errors in said plurality of bearer data packets to obtain a bit error rate (BER) level, and wherein said error rate level determination is based on said current BER level.*

*33. The apparatus of claim 32, wherein said error correction algorithm selection comprises setting at least one BER threshold level to create a plurality of BER ranges corresponding to the plurality of error correction algorithms, and selecting an error correction algorithm that corresponds to the BER range that includes the current BER level.*

*34. The apparatus of claim 25, wherein said error rate level determination comprises correcting said plurality of bearer data packets and detecting a number of defective bearer data packets to obtain a current block error rate (BLER) level, and wherein said error correction algorithm determination is based on said current BLER level.*

*35. The apparatus of claim 34, wherein said error correction algorithm selection comprises setting a minimum BLER threshold level and a maximum BLER threshold level to create an acceptable BLER range, selecting a current error correction algorithm if said acceptable BLER range includes said current BLER level and selecting an error correction algorithm different from said current error correction algorithm if said acceptable BLER range does not include said current BLER level.*

*36. The apparatus of claim 35, wherein said plurality of error correction algorithms comprises differing overhead levels, and said error correction algorithm determination further comprises selecting an error correction algorithm with a next lower overhead than that of said current error correction algorithm if said current BLER level is below said minimum BLER threshold level and selecting an error correction algorithm with a next higher overhead than that of said current error correction algorithm if said current BLER level is above said maximum BLER threshold level.*

* * * * *